United States Patent [19]
Tanaka et al.

[11] Patent Number: 5,999,575
[45] Date of Patent: Dec. 7, 1999

[54] CHANNEL SEPARATING FILTER APPARATUS, PSK DEMODULATOR APPARATUS AND PSK RECEIVER APPARATUS EACH EQUIPPED WITH CHANNEL SEPARATING FILTER APPARATUS

[75] Inventors: Ryohei Tanaka, Takarazuka; Minoru Okada, Minoo; Shinsuke Hara, Ikeda; Shozo Komaki, Osaka; Norihiko Morinaga, Suita, all of Japan

[73] Assignee: Daihen Corporation, Osaki, Japan

[21] Appl. No.: 08/784,054

[22] Filed: Jan. 17, 1997

[30] Foreign Application Priority Data

Jan. 18, 1996 [JP] Japan ................................. 8-006445

[51] Int. Cl.[6] ........................... H04L 27/22; H04B 1/10
[52] U.S. Cl. ........................ 375/329; 375/350; 370/497
[58] Field of Search ..................................... 375/279, 329, 375/350; 370/497; 329/304; 708/300

[56] References Cited

U.S. PATENT DOCUMENTS

| | | | |
|---|---|---|---|
| 5,226,057 | 7/1993 | Boren ....................................... | 375/350 |
| 5,289,464 | 2/1994 | Wang ....................................... | 370/330 |
| 5,490,173 | 2/1996 | Whikehart et al. ....................... | 375/316 |
| 5,533,050 | 7/1996 | Isard et al. .............................. | 375/229 |
| 5,627,859 | 5/1997 | Parr ......................................... | 375/350 |
| 5,812,608 | 9/1998 | Valimaki et al. ........................ | 375/331 |
| 5,841,811 | 11/1998 | Song ....................................... | 375/235 |

OTHER PUBLICATIONS

F. Takahata, (1987) "A PSK Group Modem for Satellite Communications" IEEE Journal on Selected Areas in Communication, vol. SAC-5(4):648–661, May 1987.

*Primary Examiner*—Young T. Tse
*Attorney, Agent, or Firm*—Scully, Scott, Murphy & Presser

[57] ABSTRACT

There is disclosed a channel separating filter apparatus for separating a frequency-multiplexed signal comprised of channel signals into respective channel signals. A frequency-converting section frequency-converts the frequency-multiplexed signal into a plurality of channel signals, so that an average value of carrier wave frequencies of two channel signals which are located in the center of the frequency-multiplexed signal and are adjacent to each other becomes substantially zero, and then outputs the plurality of frequency-converted channel signals. Thereafter, a channel separating section separates the plurality of frequency-converted channel signals outputted from the frequency-converting section into respective channel signals each having only a frequency component of each channel signal, thereby separating the frequency-multiplexed signal into at least two channel signals.

6 Claims, 29 Drawing Sheets

CHANNEL SEPARATING FILTER BANK 10 (2-ND PART)

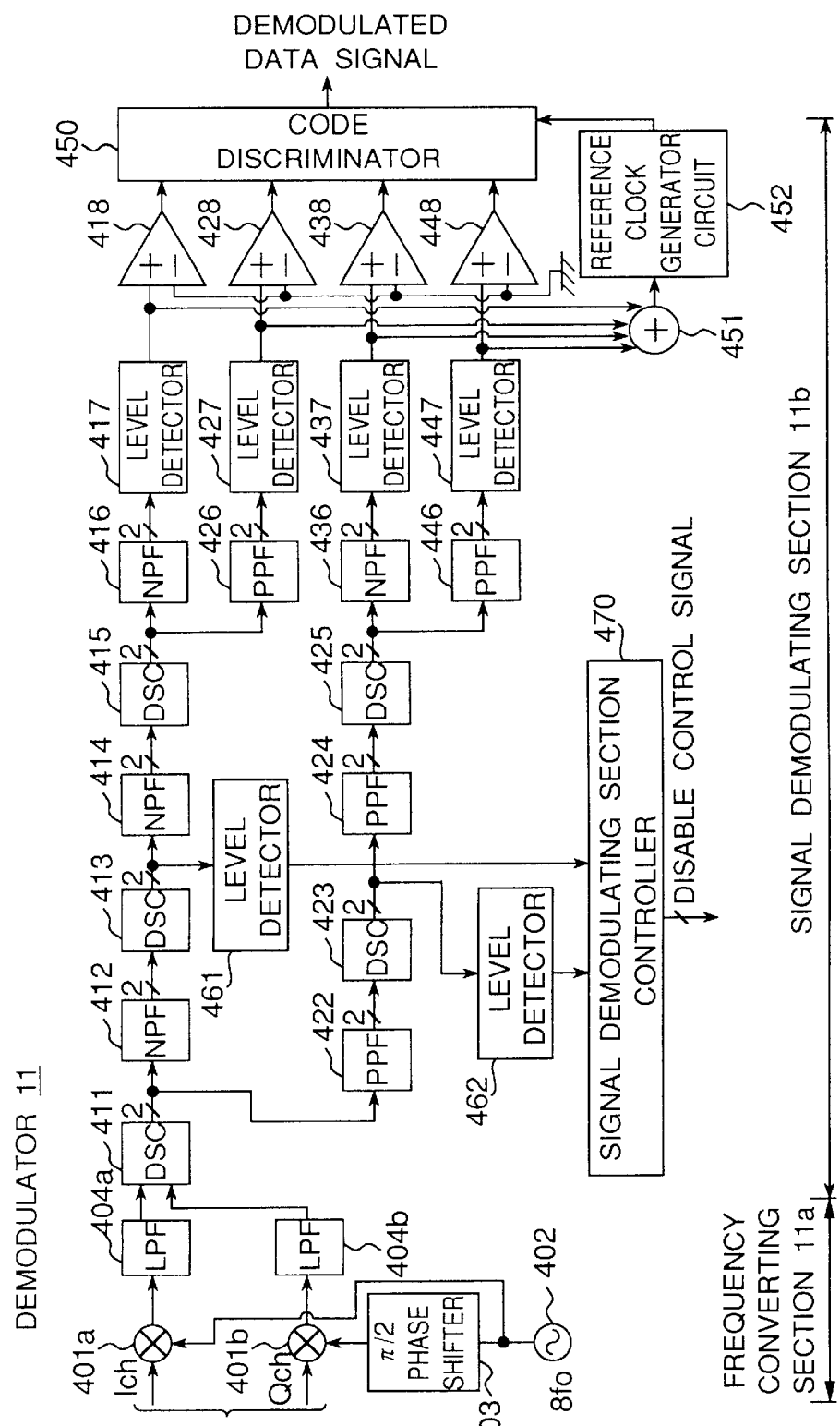

OUTPUT SIGNAL FROM HIGH FREQUENCY AMPLIFIER 2

OUTPUT SIGNAL FROM EACH OF LPFs 7a AND 7b

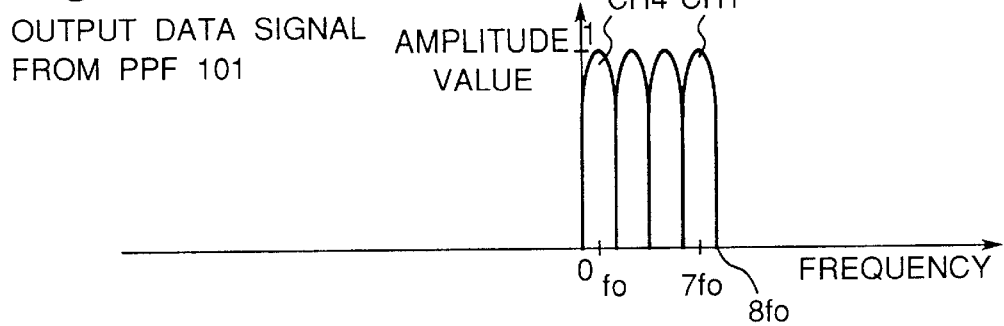
Fig.6A OUTPUT DATA SIGNAL FROM PPF 101
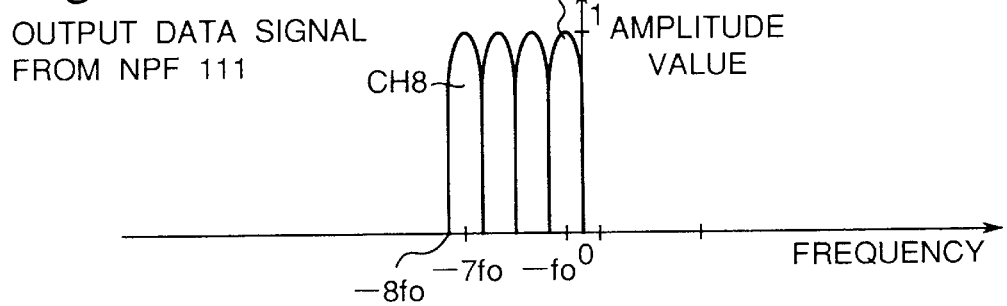
Fig.6B OUTPUT DATA SIGNAL FROM NPF 111
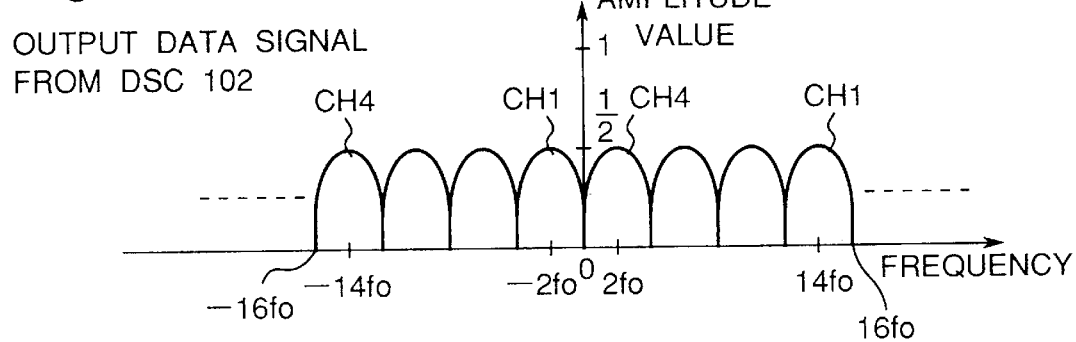
Fig.6C OUTPUT DATA SIGNAL FROM DSC 102
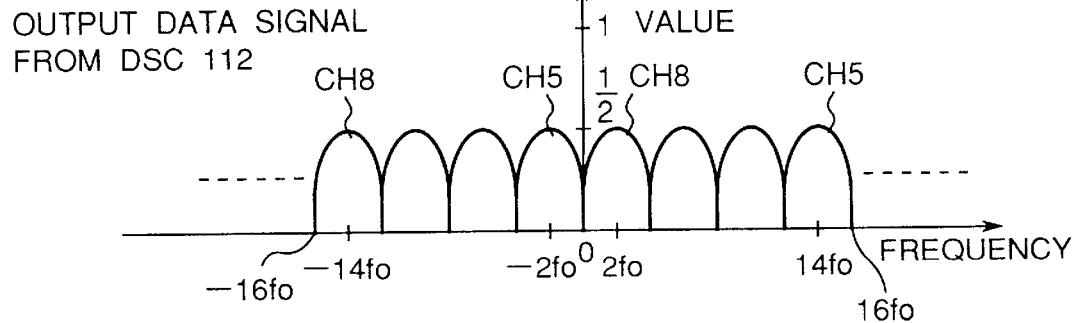
Fig.6D OUTPUT DATA SIGNAL FROM DSC 112

Fig. 7A OUTPUT DATA SIGNAL FROM PPF 201
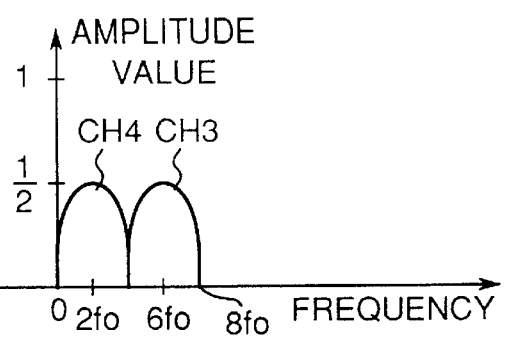
Fig. 7B OUTPUT DATA SIGNAL FROM NPF 211
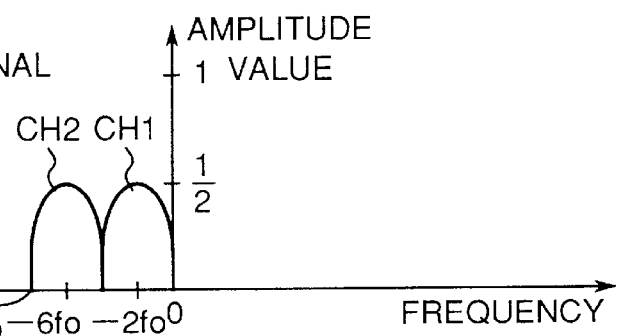
Fig. 7C OUTPUT DATA SIGNAL FROM DSC 202
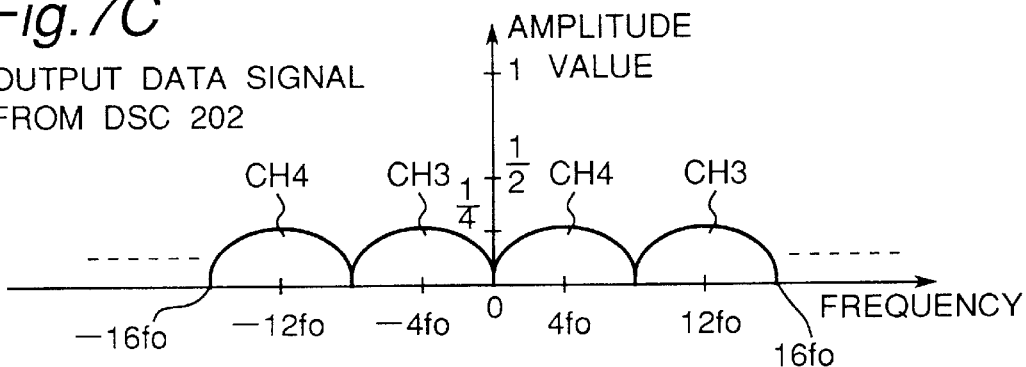
Fig. 7D OUTPUT DATA SIGNAL FROM DSC 212
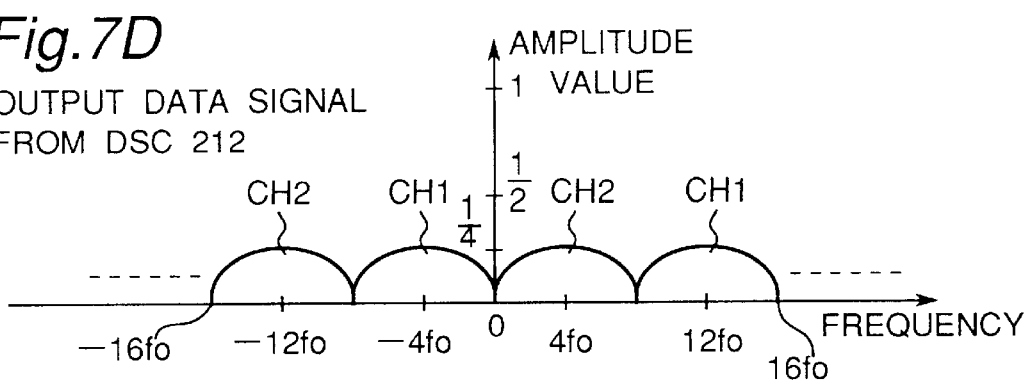

OUTPUT DATA SIGNAL
FROM PPF 321

OUTPUT DATA SIGNAL
FROM NPF 331

OUTPUT DATA SIGNAL
FROM DSC 322

OUTPUT DATA SIGNAL
FROM DSC 332

OUTPUT DATA SIGNAL FROM EACH OF LPFs 404a AND 404b OF DEMODULATOR 11-1

OUTPUT DATA SIGNAL FROM EACH OF LPFs 404a AND 404b OF DEMODULATOR 11-2

SAMPLING SIGNAL AFTER IMPULSE RESPONSE
PROCESSING OF LPF OF FIR TYPE DIGITAL FILTER

SAMPLING SIGNAL AFTER IMPULSE RESPONSE
PROCESSING OF NPF OF FIR TYPE DIGITAL FILTER

AMPLITUDE TO FREQUENCY CHARACTERISTIC OF LOW-PASS FILTER (LPF)

AMPLITUDE TO FREQUENCY CHARACTERISTIC OF NEGATIVE PASS FILTER (NPF)

AMPLITUDE TO FREQUENCY CHARACTERISTIC OF POSITIVE PASS FILTER (PPF)

SAMPLING SIGNAL PRIOR TO DOWNSAMPLING PROCESS
( A SERIES OF INPUT SIGNAL x(n) PRIOR TO PROCESSING )

SAMPLING SIGNAL AFTER DOWNSAMPLING PROCESS WITH Md=2
( A SERIES OF OUTPUT SIGNAL y(n) )

AMPLITUDE TO FREQUENCY CHARACTERISTIC OF SIGNAL PRIOR TO DOWNSAMPLING PROCESS

AMPLITUDE TO FREQUENCY CHARACTERISTIC OF SIGNAL AFTER DOWNSAMPLING PROCESS WITH Md=2

SIGNAL SPACE DIAGRAM OF $\frac{\pi}{4}$-SHIFT QPSK SIGNAL

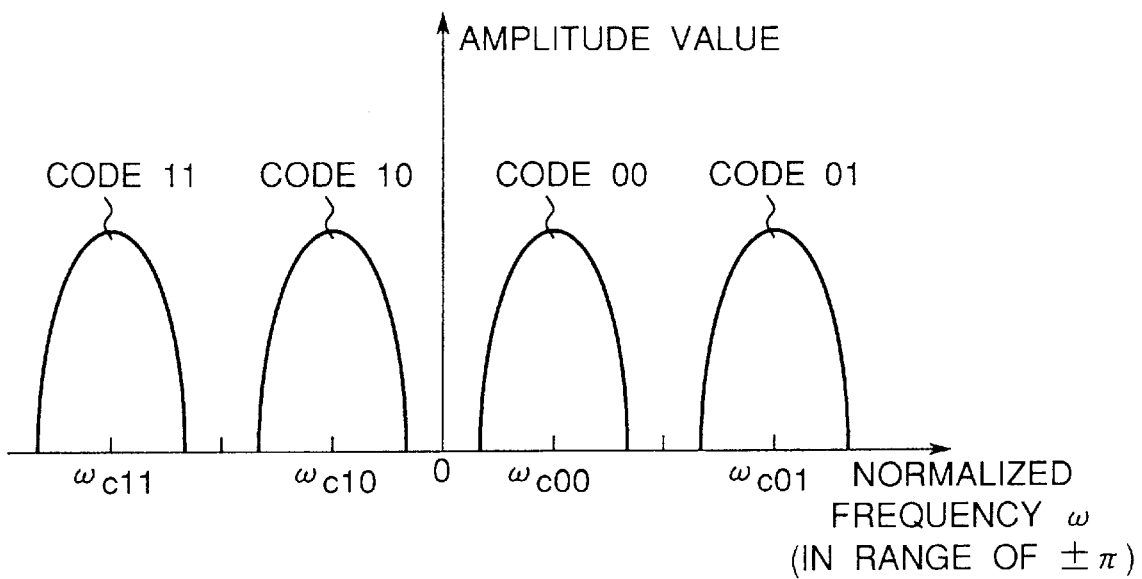

FREQUENCY CHARACTERISTIC OF TDMA-TDD SYSTEM

TIME DIVISION MULTIPLEX FORMAT OF TDMA-TDD SYSTEM

CONSTRUCTION OF PHS SYSTEM

FREQUENCY ARRAGEMENT OF PHS SYSTEM

CHANNEL SEPARATING FILTER APPARATUS, PSK DEMODULATOR APPARATUS AND PSK RECEIVER APPARATUS EACH EQUIPPED WITH CHANNEL SEPARATING FILTER APPARATUS

BACKGROUND OF THE INVENTION

1. Field of the Invention

The present invention relates to a channel separating filter apparatus, a Phase Shift Keying (referred to as a PSK hereinafter) demodulator apparatus and a PSK receiver apparatus, and in particular, to a channel separating filter apparatus for separating a frequency-multiplexed signal comprised of channel signals into a plurality of channel signals, a PSK demodulator apparatus constituted by using the channel separating filter apparatus, and a PSK receiver apparatus constituted by using the channel separating filter apparatus.

2. Description of the Prior Art

In a personal handy phone system (referred to as a PHS system hereinafter) which is so-called a simple type portable telephone system, as shown in FIG. 20A, a band using one carrier wave is used for one base station. In this case, a time division multiplex access-time division duplex system (referred to as a TDMA-TDD system hereinafter) is used, where three mobile terminals can be simultaneously used at maximum per base station. In an actual PHS system, a channel for line control is necessary, and therefore, as shown in FIG. 20B, so-called ping-pong transmission is executed by using four channels in one direction.

In order to increase the number of terminals within one service area 110 in a prior art PHS system, a plurality of carrier waves CA1, CA2 and CA3 are used as shown in FIGS. 21A and 21B. In other words, the number of base stations using one carrier wave is increased to a plural number or more within one service area. In this case, with regard to the frequency of the carrier wave used by each base station, an unoccupied channel out of pre-allocated 77 channels is used in the case of outgoing call from the base station or in the case of incoming call to a mobile terminal station. Furthermore, in the prior art PHS system, a band-pass filter is used for separation of channels, and a delay detection method or differential coherent detection method is widely used for demodulation of a signal modulated by a π/4-shift QPSK (Quadrature Phase Shift Keying) method.

However, when a band-pass filter is used for separation of channels in a radio system using frequency-multiplexed channels, an inductance circuit is used in the band-pass filter. Therefore, there are the following problems:

(a) the size of the circuit thereof becomes larger;

(b) the manufacturing cost thereof becomes relatively expensive; and (c) it is difficult to adjust the center frequency of the pass-band.

Furthermore, the use of the delay detection method or differential coherent detection method when demodulating a signal modulated by π/4-shift QPSK has been accompanied by such a problem that it is necessary to provide a relatively complicated circuit.

SUMMARY OF THE INVENTION

An essential object of the present invention is therefore to provide a channel separating filter apparatus having a circuit which is more compact and lightweight than that of the prior art, capable of reducing the manufacturing cost and adjusting the center frequency of the pass-band with a higher precision.

Another object of the present invention is to provide a PSK demodulator apparatus having a simpler circuit than that of the prior art.

A further object of the present invention is to provide a PSK receiver apparatus having a simpler circuit than that of the prior art.

In order to achieve the above-mentioned objective, according to one aspect of the present invention, there is provided a channel separating filter apparatus for separating a frequency-multiplexed signal comprised of channel signals into respective channel signals, comprising:

frequency-converting means for frequency-converting the frequency-multiplexed signal into a plurality of channel signals, so that an average value of carrier wave frequencies of two channel signals which are located in a center of the frequency-multiplexed signal and are adjacent to each other becomes substantially zero, and for outputting the plurality of frequency-converted channel signals; and channel separating means for separating the plurality of frequency-converted channel signals outputted from said frequency-converting means into respective channel signals each having only a frequency component of each channel signal, wherein said channel separating means comprises at least first stage filter bank, and wherein said first stage filter bank comprises:

a first positive pass filter for band-pass-filtering only a first signal having a signal component of a predetermined positive frequency from the plurality of frequency-converted channel signals outputted from said frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the plurality of frequency-converted channel signals outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, thereby separating the frequency-multiplexed signal into at least two channel signals.

In the above-mentioned channel separating filter apparatus, said channel separating means preferably further comprises at least second stage filter bank, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

third processing means for executing a third downsampling process on the band-pass-filtered fifth signal outputted from said second positive pass filter and for outputting a sixth signal including a signal of at least one further channel which is obtained by the third downsampling process;

a second negative pass filter for band-pass-filtering only a seventh signal having a signal component of a predetermined negative frequency from the second signal outputted from said first processing means, and for outputting the band-pass-filtered seventh signal; and fourth processing means for executing a fourth downsampling process on the band-pass-filtered seventh signal outputted from said second negative pass filter and for outputting an eighth signal including a signal of at least one further channel which is obtained by the fourth downsampling process;

a third positive pass filter for band-pass-filtering only a ninth signal having a signal component of a predetermined positive frequency from the fourth signal outputted from said second processing means, and for outputting the band-pass-filtered ninth signal;

fifth processing means for executing a fifth downsampling process on the band-pass-filtered ninth signal outputted from said third positive pass filter and for outputting a tenth signal including a signal of at least one further channel which is obtained by the fifth downsampling process;

a third negative pass filter for band-pass-filtering only an eleventh signal having a signal component of a predetermined negative frequency from the fourth signal outputted from said second processing means, and for outputting the band-pass-filtered eleventh signal; and sixth processing means for executing a sixth downsampling process on the band-pass-filtered eleventh signal outputted from said third negative pass filter and for outputting a twelfth signal including a signal of at least one further channel which is obtained by the sixth downsampling process, thereby separating the frequency-multiplexed signal into at least four channel signals.

The channel separating filter apparatus preferably further comprises:

first detecting means for detecting a signal level of the second signal outputted from said first processing means and for outputting a first detection signal when no second signal exists;

second detecting means for detecting a signal level of the fourth signal outputted from said second processing means and for outputting a second detection signal when no fourth signal exists; and operation control means, in response to the first detection signal outputted from said first detecting means, for controlling said second positive pass filter, said second negative pass filter and said third and fourth processing means to stop operations of said second positive pass filter, said second negative pass filter and said third and fourth processing means, and further, in response to the second detection signal outputted from said second detecting means, for controlling said third positive pass filter, said third negative pass filter and said fifth and sixth processing means to stop operations of said third positive pass filter, said third negative pass filter and said fifth and sixth processing means.

According to another aspect of the present invention, there is provided a PSK demodulator apparatus for demodulating a PSK-modulated signal modulated according to at least two codes, comprising:

demodulating means for detecting peak signals respectively having frequency components of signal peaks in an amplitude to frequency characteristic of the PSK-modulated signal by utilizing that the signal peaks are different from each other in the amplitude to frequency characteristic depending on respective codes of the PSK-modulated signal, and for outputting a demodulated signal representing one code corresponding to one of the detected peak signals.

In the above-mentioned PSK demodulator apparatus, said demodulating means preferably comprises:

further frequency-converting means for frequency-converting the PSK-modulated signal into a frequency-converted PSK-modulated signal, so that a center frequency of the PSK-modulated signal becomes substantially zero, and for outputting the frequency-converted PSK-modulated signal; and signal demodulating means for demodulating the frequency-converted PSK-modulated signal outputted from said further frequency-converting means so as to generate a demodulated signal representing one code, and for outputting the generated demodulated signal, wherein said signal demodulating means comprises at least first stage filter bank, and wherein said first stage filter bank comprises:

a first positive pass filter for band-pass-filtering only a first signal having a signal component of a predetermined positive frequency from the frequency-converted PSK-modulated signal outputted from said further frequency-converting means, and for outputting the band-pass-filtered first signal;

a first negative pass filter for band-pass-filtering only a second signal having a signal component of a predetermined negative frequency from the frequency-converted PSK-modulated signal outputted from said further frequency-converting means, and for outputting the band-pass-filtered second signal;

first code discriminating means for detecting a signal level of the first signal outputted from said first positive pass filter, and for outputting a first demodulated signal representing one code corresponding to a frequency of the first signal when detecting the signal level; and second code discriminating means for detecting a signal level of the second signal outputted from said first negative pass filter, and for outputting a second demodulated signal representing one code corresponding to a frequency of the second signal when detecting the signal level.

In the above-mentioned PSK demodulator apparatus, said demodulating means preferably comprises:

further frequency-converting means for frequency-converting the PSK-modulated signal into a frequency-converted PSK-modulated signal, so that a center frequency of the PSK-modulated signal becomes substantially zero, and for outputting the frequency-converted PSK-modulated signal; and signal demodulating means for demodulating the frequency-converted PSK-modulated signal outputted from said further frequency-converting means so as to generate a demodulated signal representing one code, and for outputting the generated demodulated signal, wherein said signal demodulating means comprises at least first and second stage filter bank, wherein said first stage filter bank comprises:

a first positive pass filter for band-pass-filtering only a first signal having a signal component of a predetermined positive frequency from the frequency-converted PSK-modulated signal outputted from said further frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the frequency-converted PSK-modulated signal outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

a second negative pass filter for band-pass-filtering only a sixth signal having a signal component of a predetermined negative frequency from the second signal outputted from said first processing means, and for outputting the band-pass-filtered sixth signal;

a third positive pass filter for band-pass-filtering only a seventh signal having a signal component of a predetermined positive frequency from the fourth signal outputted from said second processing means, and for outputting the band-pass-filtered seventh signal;

a third negative pass filter for band-pass-filtering only an eighth signal having a signal component of a predetermined negative frequency from the fourth signal outputted from said second processing means, and for outputting the band-pass-filtered eighth signal;

first code discriminating means for detecting a signal level of the fifth signal outputted from said second positive pass filter, and for outputting a first demodulated signal representing one code corresponding to a frequency of the fifth signal when detecting the signal level;

second code discriminating means for detecting a signal level of the sixth signal outputted from said second negative pass filter, and for outputting a second demodulated signal representing one code corresponding to a frequency of the sixth signal when detecting the signal level;

third code discriminating means for detecting a signal level of the seventh signal outputted from said third positive pass filter, and for outputting a third demodulated signal representing one code corresponding to a frequency of the seventh signal when detecting the signal level; and fourth code discriminating means for detecting a signal level of the eighth signal outputted from said third negative pass filter, and for outputting a fourth demodulated signal representing one code corresponding to a frequency of the eighth signal when detecting the signal level.

The above-mentioned PSK demodulator apparatus preferably further comprises:

first detecting means for detecting a signal level of the second signal outputted from said first processing means, and for outputting a first detection signal when no second signal exists;

second detecting means for detecting a signal level of the fourth signal outputted from said second processing means, and for outputting a second detection signal when no fourth signal exists; and operation control means, in response to the first detection signal outputted from said first detecting means, for controlling said second positive pass filter, said second negative pass filter, and said first and second code discriminating means to stop operations of said second positive pass filter, said second negative pass filter, and said first and second code discriminating means, and further, in response to the second detection signal outputted from said second detecting means, for controlling said third positive pass filter, said third negative pass filter and said third and fourth code discriminating means to stop operations of said third positive pass filter, said third negative pass filter and said third and fourth code discriminating means.

According to a further aspect of the present invention, there is provided a PSK receiver apparatus comprising:

receiving means for receiving a radio signal of a frequency-multiplexed signal comprised of channel signals each being a PSK-modulated signal;

a channel separating filter apparatus for separating the radio signal received by said receiving means into respective channel signals; and a PSK demodulator apparatus for demodulating the respective channel signals separated by said channel separating filter apparatus so as to generate respective demodulated channel signals, and for outputting the generated respective demodulated channel signals, and wherein said channel separating filter apparatus comprises:

frequency-converting means for frequency-converting the frequency-multiplexed signal into a plurality of channel signals, so that an average value of carrier wave frequencies of two channel signals which are located in a center of the frequency-multiplexed signal and are adjacent to each other becomes substantially zero, and for outputting the plurality of frequency-converted channel signals; and channel separating means for separating the plurality of frequency-converted channel signals outputted from said frequency-converting means into respective channel signals each having only a frequency component of each channel signal, wherein said channel separating means comprises at least first stage filter bank, and wherein said first stage filter bank comprises:

a first positive pass filter for band-pass-filtering only a first signal having a signal component of a predetermined positive frequency from the plurality of frequency-converted channel signals outputted from said frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the plurality of frequency-converted channel signals outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, thereby separating the frequency-multiplexed signal into at least two channel signals.

In the above-mentioned PSK receiver apparatus, said channel separating means preferably further comprises at least second stage filter bank, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

third processing means for executing a third downsampling process on the band-pass-filtered fifth signal outputted from said second positive pass filter and for outputting a sixth signal including a signal of at least one further channel which is obtained by the third downsampling process;

a second negative pass filter for band-pass-filtering only a seventh signal having a signal component of a predetermined negative frequency from the second signal outputted from said first processing means, and for outputting the band-pass-filtered seventh signal; and fourth processing means for executing a fourth downsampling process on the band-pass-filtered seventh signal outputted from said second negative pass filter and for outputting an eighth signal including a signal of at least one further channel which is obtained by the fourth downsampling process;

a third positive pass filter for band-pass-filtering only a ninth signal having a signal component of a predetermined positive frequency from the fourth signal outputted from said second processing means, and for outputting the band-pass-filtered ninth signal;

fifth processing means for executing a fifth downsampling process on the band-pass-filtered ninth signal outputted from said third positive pass filter and for outputting a tenth signal including a signal of at least one further channel which is obtained by the fifth downsampling process;

a third negative pass filter for band-pass-filtering only an eleventh signal having a signal component of a predetermined negative frequency from the fourth signal outputted from said second processing means, and for outputting the band-pass-filtered eleventh signal; and sixth processing means for executing a sixth downsampling process on the band-pass-filtered eleventh signal outputted from said third negative pass filter and for outputting a twelfth signal including a signal of at least one further channel which is obtained by the sixth downsampling process, thereby separating the frequency-multiplexed signal into at least four channel signals.

In the above-mentioned PSK receiver apparatus, said channel separating filter apparatus preferably further comprises:

first detecting means for detecting a signal level of the second signal outputted from said first processing means and for outputting a first detection signal when no second signal exists;

second detecting means for detecting a signal level of the fourth signal outputted from said second processing means and for outputting a second detection signal when no fourth signal exists; and operation control means, in response to the first detection signal outputted from said first detecting means, for controlling said second positive pass filter, said second negative pass filter and said third and fourth processing means to stop operations of said second positive pass filter, said second negative pass filter and said third and fourth processing means, and further, in response to the second detection signal outputted from said second detecting means, for controlling said third positive pass filter, said third negative pass filter and said fifth and sixth processing means to stop operations of said third positive pass filter, said third negative pass filter and said fifth and sixth processing means.

According to a still further aspect of the present invention, there is provided a PSK receiver apparatus comprising:

receiving means for receiving a radio signal of a frequency-multiplexed signal comprised of channel signals each being a PSK-modulated signal;

a channel separating filter apparatus for separating the radio signal received by said receiving means into respective channel signals; and a PSK demodulator apparatus for demodulating the respective channel signals separated by said channel separating filter apparatus so as to generate respective demodulated channel signals, and for outputting the generated respective demodulated channel signals, wherein said PSK demodulator apparatus demodulates a PSK-modulated signal modulated according to at least two codes, and wherein said PSK demodulator apparatus comprises:

demodulating means for detecting peak signals respectively having frequency components of signal peaks in an amplitude to frequency characteristic of the PSK-modulated signal by utilizing that the signal peaks are different from each other in the amplitude to frequency characteristic depending on respective codes of the PSK-modulated signal, and for outputting a demodulated signal representing one code corresponding to one of the detected peak signals.

In the above-mentioned PSK receiver apparatus, said demodulating means preferably comprises:

further frequency-converting means for frequency-converting the PSK-modulated signal into a frequency-converted PSK-modulated signal, so that a center frequency of the PSK-modulated signal becomes substantially zero, and for outputting the frequency-converted PSK-modulated signal; and signal demodulating means for demodulating the frequency-converted PSK-modulated signal outputted from said further frequency-converting means so as to generate a demodulated signal representing one code, and for outputting the generated demodulated signal, wherein said signal demodulating means comprises at least first stage filter bank, and wherein said first stage filter bank comprises:

a first positive pass filter for band-pass-filtering only a first signal having a signal component of a predetermined positive frequency from the frequency-converted PSK-modulated signal outputted from said further frequency-converting means, and for outputting the band-pass-filtered first signal;

a first negative pass filter for band-pass-filtering only a second signal having a signal component of a predetermined negative frequency from the frequency-converted PSK-modulated signal outputted from said further frequency-converting means, and for outputting the band-pass-filtered second signal;

first code discriminating means for detecting a signal level of the first signal outputted from said first positive pass filter, and for outputting a first demodulated signal representing one code corresponding to a frequency of the first signal when detecting the signal level; and second code discriminating means for detecting a signal level of the second signal outputted from said first negative pass filter, and for outputting a second demodulated signal representing one code corresponding to a frequency of the second signal when detecting the signal level.

In the above-mentioned PSK receiver apparatus, said demodulating means preferably comprises:

further frequency-converting means for frequency-converting the PSK-modulated signal into a frequency-converted PSK-modulated signal, so that a center frequency of the PSK-modulated signal becomes substantially zero, and for outputting the frequency-converted PSK-modulated signal; and signal demodulating means for demodulating the frequency-converted PSK-modulated signal outputted from said further frequency-converting means so as to generate a demodulated signal representing one code, and for outputting the generated demodulated signal, wherein said signal demodulating means comprises at least first and second stage filter bank, wherein said first stage filter bank comprises:

a first positive pass filter for band-pass-filtering only a first signal having a signal component of a predetermined positive frequency from the frequency-converted PSK-modulated signal outputted from said further frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the frequency-converted PSK-modulated signal outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

a second negative pass filter for band-pass-filtering only a sixth signal having a signal component of a predetermined negative frequency from the second signal outputted from said first processing means, and for outputting the band-pass-filtered sixth signal;

a third positive pass filter for band-pass-filtering only a seventh signal having a signal component of a predetermined positive frequency from the fourth signal outputted from said second processing means, and for outputting the band-pass-filtered seventh signal;

a third negative pass filter for band-pass-filtering only an eighth signal having a signal component of a predetermined negative frequency from the fourth signal outputted from said second processing means, and for outputting the band-pass-filtered eighth signal;

first code discriminating means for detecting a signal level of the fifth signal outputted from said second positive pass filter, and for outputting a first demodulated signal representing one code corresponding to a frequency of the fifth signal when detecting the signal level;

second code discriminating means for detecting a signal level of the sixth signal outputted from said second negative pass filter, and for outputting a second demodulated signal representing one code corresponding to a frequency of the sixth signal when detecting the signal level;

third code discriminating means for detecting a signal level of the seventh signal outputted from said third positive pass filter, and for outputting a third demodulated signal representing one code corresponding to a frequency of the seventh signal when detecting the signal level; and fourth code discriminating means for detecting a signal level of the eighth signal outputted from said third negative pass filter, and for outputting a fourth demodulated signal representing one code corresponding to a frequency of the eighth signal when detecting the signal level.

The above-mentioned PSK receiver apparatus preferably further comprises:

first detecting means for detecting a signal level of the second signal outputted from said first processing means, and for outputting a first detection signal when no second signal exists;

second detecting means for detecting a signal level of the fourth signal outputted from said second processing means, and for outputting a second detection signal when no fourth signal exists; and operation control means, in response to the first detection signal outputted from said first detecting means, for controlling said second positive pass filter, said second negative pass filter, and said first and second code discriminating means to stop operations of said second positive pass filter, said second negative pass filter, and said first and second code discriminating means, and further, in response to the second detection signal outputted from said second detecting means, for controlling said third positive pass filter, said third negative pass filter and said third and fourth code discriminating means to stop operations of said third positive pass filter, said third negative pass filter and said third and fourth code discriminating means.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 4 is a block diagram showing the demodulator 11 shown in FIG. 1;

FIGS. 5A and 5B are amplitude to frequency characteristic charts showing an operation of the π/4-shift QPSK receiver apparatus shown in FIG. 1, wherein FIG. 5A is an amplitude to frequency characteristic chart of an output signal from a high-frequency amplifier 2 shown in FIG. 1, and FIG. 5B is an amplitude to frequency characteristic chart of an output signal from each of LPFs 7a and 7b shown in FIG. 1;

FIGS. 6A, 6B, 6C and 6D are amplitude to frequency characteristic charts showing an operation of the π/4-shift QPSK receiver apparatus shown in FIG. 1, wherein FIG. 6A is the amplitude to frequency characteristic chart of an output signal from a PPF 101 shown in FIG. 2, FIG. 6B is the amplitude to frequency characteristic chart of an output signal from an NPF 111 shown in FIG. 2, FIG. 6C is the amplitude to frequency characteristic chart of an output signal from a DSC 102 shown in FIG. 2, and FIG. 6D is the amplitude to frequency characteristic chart of an output signal from a DSC 112 shown in FIG. 2;

FIGS. 7A, 7B, 7C and 7D are amplitude to frequency characteristic charts showing an operation of the π/4-shift QPSK receiver apparatus shown in FIG. 1, wherein FIG. 7A is the amplitude to frequency characteristic chart of an output signal from a PPF 201 shown in FIG. 2, FIG. 7B is the amplitude to frequency characteristic chart of an output signal from an NPF 211 shown in FIG. 2, FIG. 7C is the amplitude to frequency characteristic chart of an output signal from a DSC 202 shown in FIG. 2, and FIG. 7D is the amplitude to frequency characteristic chart of an output signal from a DSC 212 shown in FIG. 2;

FIGS. 8A, 8B, 8C and 8D are amplitude to frequency characteristic charts showing an operation of the π/4-shift QPSK receiver apparatus shown in FIG. 1, wherein FIG. 8A is the amplitude to frequency characteristic chart of an output signal from a PPF 321 shown in FIG. 2, FIG. 8B is the amplitude to frequency characteristic chart of an output signal from an NPF 331 shown in FIG. 2, FIG. 8C is the amplitude to frequency characteristic chart of an output signal from a DSC 322 shown in FIG. 2, and FIG. 8D is the amplitude to frequency characteristic chart of an output signal from a DSC 332 shown in FIG. 2;

FIGS. 9A and 9B are amplitude to frequency characteristic charts showing an operation of the π/4-shift QPSK receiver apparatus shown in FIG. 1, wherein FIG. 9A is the amplitude to frequency characteristic chart of an output signal from each of LPFs 404a and 404b of a demodulator 11-1 shown in FIG. 3, and FIG. 9B is the amplitude to frequency characteristic chart of an output signal from each of the LPFs 404a and 404b of a demodulator 11-2 shown in FIG. 3;

FIG. 19 is an amplitude to frequency characteristic chart showing a code discriminating process of the demodulator 11 shown in FIG. 3;

DETAILED DESCRIPTION OF THE PREFERRED EMBODIMENTS

Preferred embodiments of the present invention will be described below with reference to the accompanying drawings.

Figure 1:
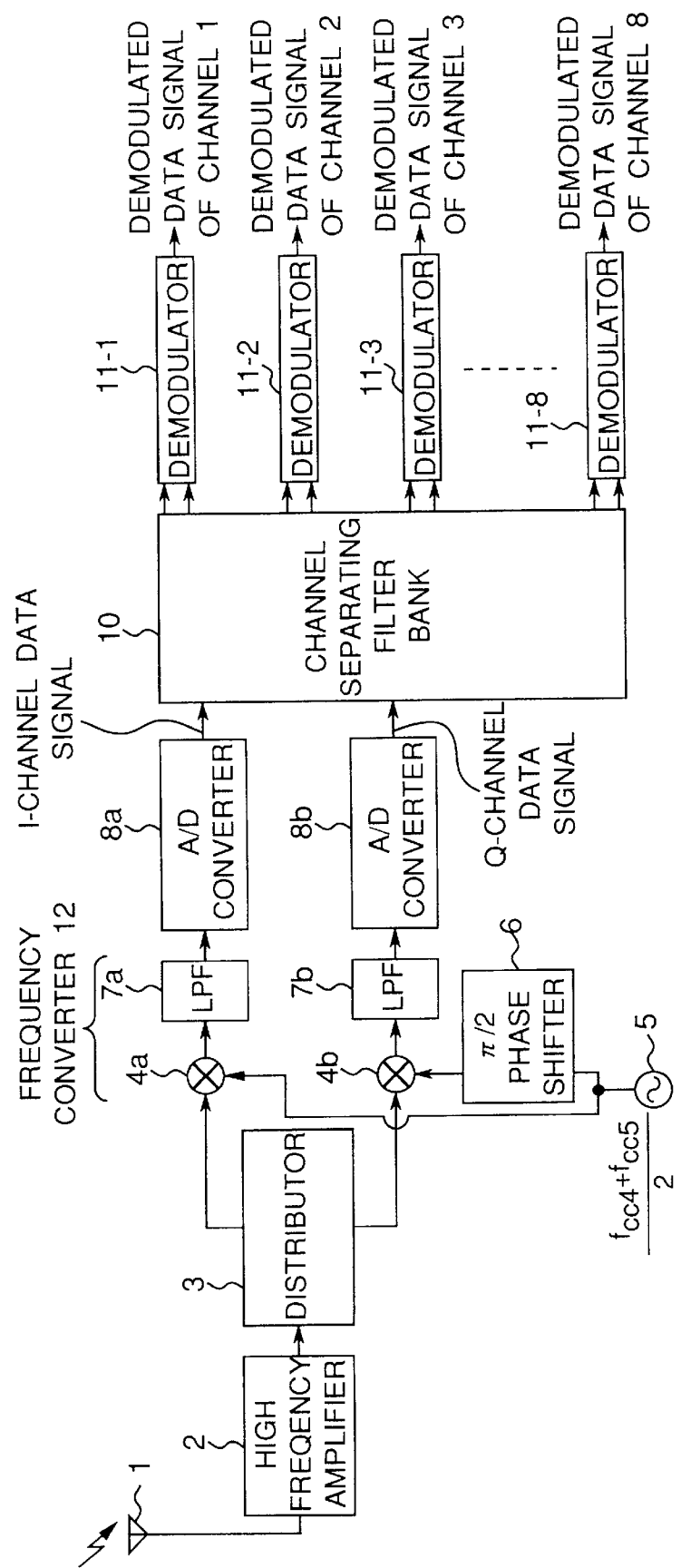
FIG. 1 is a block diagram showing a π/4-shift QPSK receiver apparatus having a channel separating filter bank 10 and a demodulator 11 employing a filter bank according to a preferred embodiment of the present invention.
Figure 2:
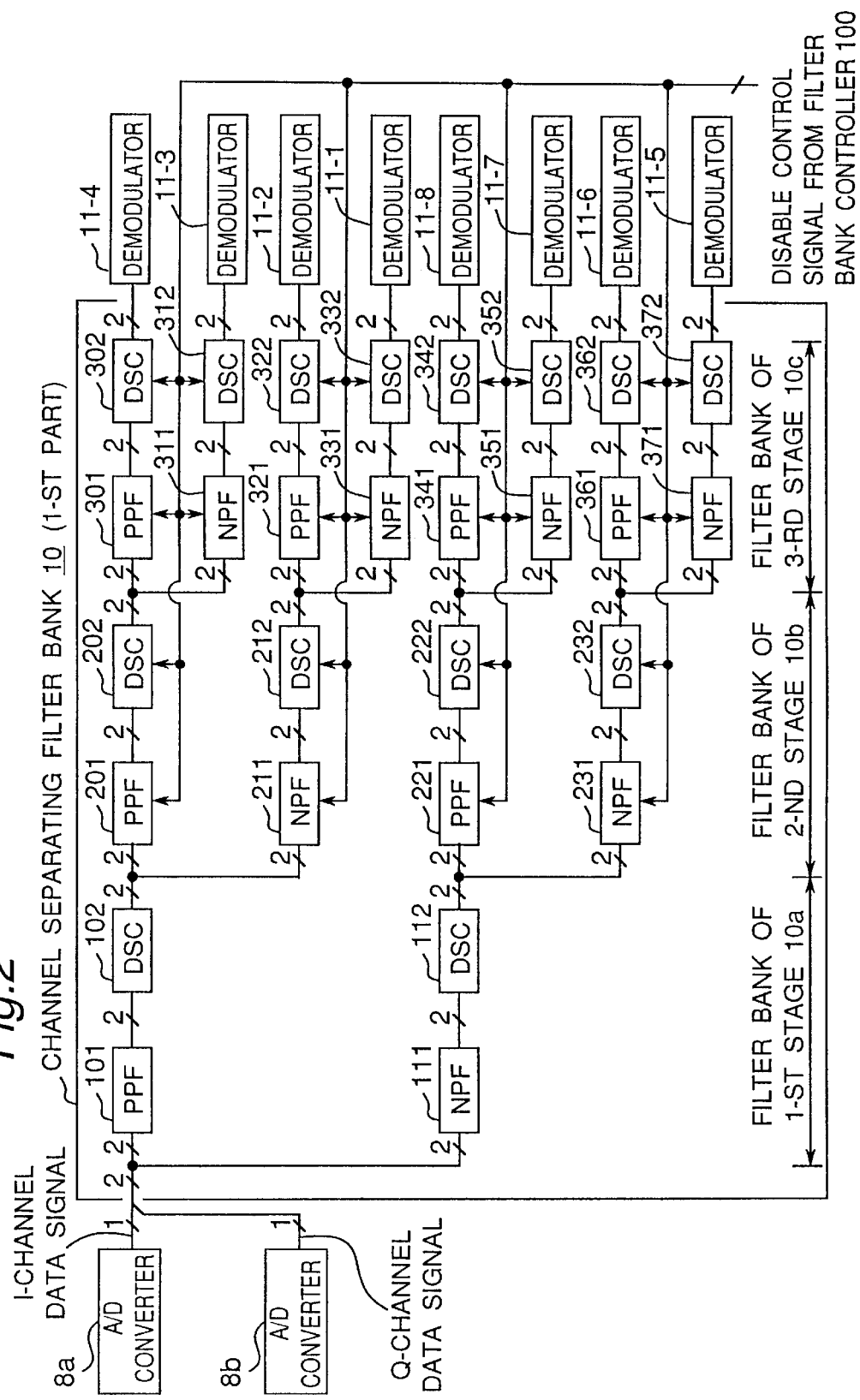
FIG. 2 is a block diagram showing a first part of the channel separating filter bank 10 shown in FIG. 1.
Figure 3:
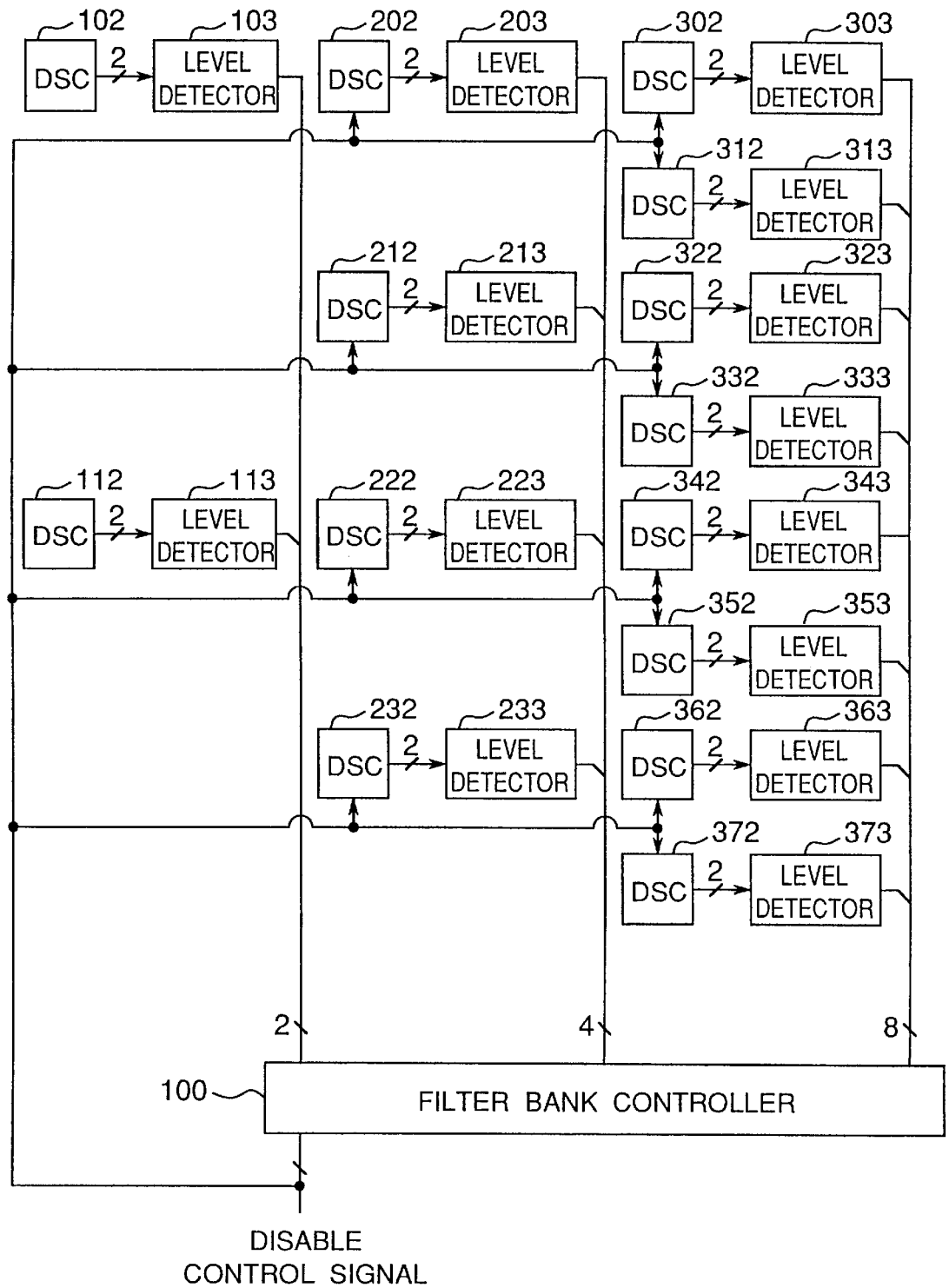
FIG. 3 is a block diagram showing a second part of the channel separating filter bank 10 shown in FIG. 1.

FIG. 1 is a block diagram showing a π/4-shift QPSK receiver apparatus having a channel separating filter bank 10 and a demodulator 11 using a filter bank according to a preferred embodiment of the present invention. FIGS. 2 and 3 are block diagrams showing the channel separating filter bank 10 of FIG. 1. FIG. 4 is a block diagram showing the demodulator 11 of FIG. 1.

The receiver apparatus of the present preferred embodiment is characterized in comprising the channel separating filter bank 10 employing positive pass filters (each referred to as a PPF hereinafter), negative pass filters (each referred to as an NPF hereinafter) and downsampling converters (each referred to as a DSC hereinafter) and the demodulator 11 employing a filter bank comprised of the PPFs, the NPFs and the DSCs. First of all, the principles of operations and the logical analyses of the PPF, the NPF and the DSC will be described.

PRINCIPLES OF OPERATIONS AND LOGICAL ANALYSIS OF PPF AND NPF

In order to separate a frequency-multiplexed signal into a plurality of signals, the frequency-multiplexed signal is generally separated into a low-frequency component and a high-frequency component by means of a low-pass filter (referred to as an LPF hereinafter) having a transfer function $H_L(z)$ and a high-pass filter (referred to as an HPF hereinafter) having a transfer function $H_H(z)$. The present preferred embodiment employs a complex filter which can divide a signal into two parts at positive and negative frequencies, and in practical uses the followings:

(a) a PPF which passes therethrough only a positive frequency component and which has a transfer function $H_P(z)$; and (b) an NPF which passes therethrough only a negative frequency component and which has a transfer function $H_N(z)$.

These PPF and NPF are constituted by using a prior art finite impulse response type digital filter (referred to as an FIR type digital filter hereinafter).

Figure 10:
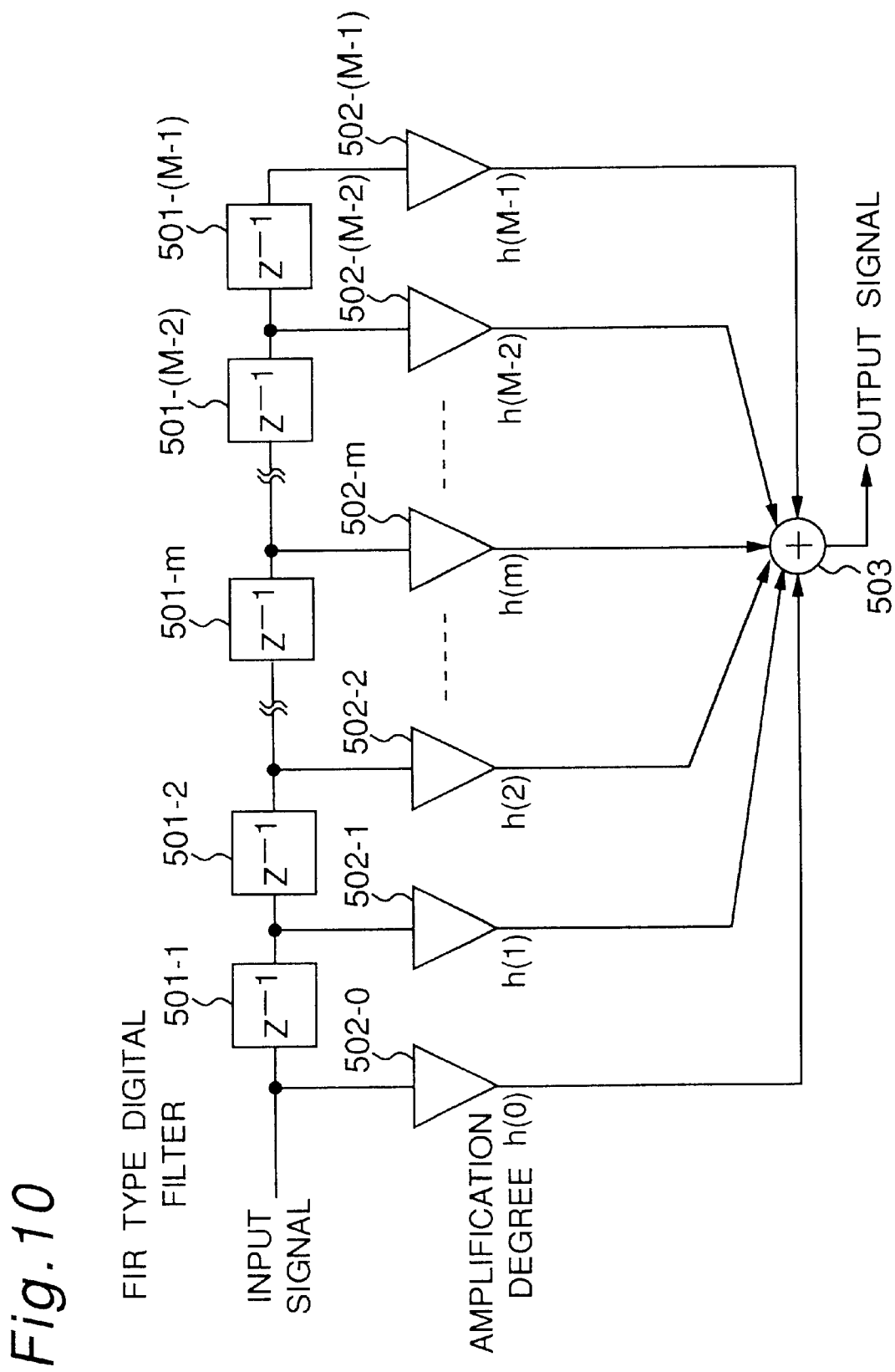
FIG. 10 is a block diagram showing a FIR type digital filter used for constituting each of the PPFs and the NPFs shown in FIGS. 2 and 3.

FIG. 10 shows a circuit diagram showing a construction of the FIR type digital filter. Referring to FIG. 10, an inputted signal is inputted to an adder 503 via an amplifier 502-0 having a predetermined amplification degree h(0), and is also inputted to the adder 503 via a plurality of (M−1) delay circuits 501-1 to 501-(M−1), each of which has the predetermined same delay amount and which are connected in series with one another, and an amplifier 502-(M−1) having a predetermined amplification degree h(M−1). Further, a signal outputted from the delay circuit 501-1 is inputted to the adder 503 via an amplifier 502-1 having a predetermined amplification degree h(1), while a signal outputted from the delay circuit 501-2 is inputted to the adder 503 via an amplifier 502-2 having a predetermined amplification degree h(2). In a manner similar to above, a signal outputted from a delay circuit 501-m is inputted to the adder 503 via an amplifier 502-m having a predetermined amplification degree h(m). In this case, m is 1, 2, 3, . . . , M−1. The adder 503 sums up a plurality M of signals inputted, and then outputs a signal resulting from the summation as an output signal. In this case, the amplifier 502-m can be considered as a multiplier for multiplying the inputted signal by the amplification degree h(m).

Next, an impulse response $H_L(z)$ of the LPF provided by the FIR type digital filter shown in FIG. 10 can be expressed by the following equation (1) using the filter factor h(m) which is the degree of amplification:

$$H_L(z) = \sum_{m=0}^{M-1} h(m) z^{-m} \quad (1)$$

Figure 11A:
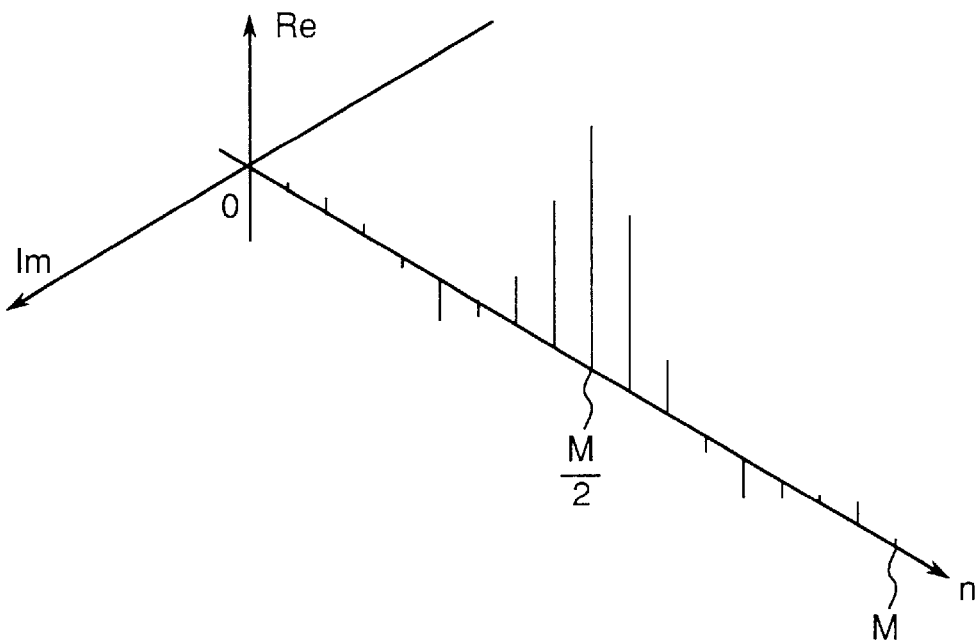
FIG. 11A is a timing chart showing a sampling signal obtained by an impulse response process of the LPF of the FIR type digital filter shown in FIG. 10 on a time base with respect to a complex plane.
Figure 11B:
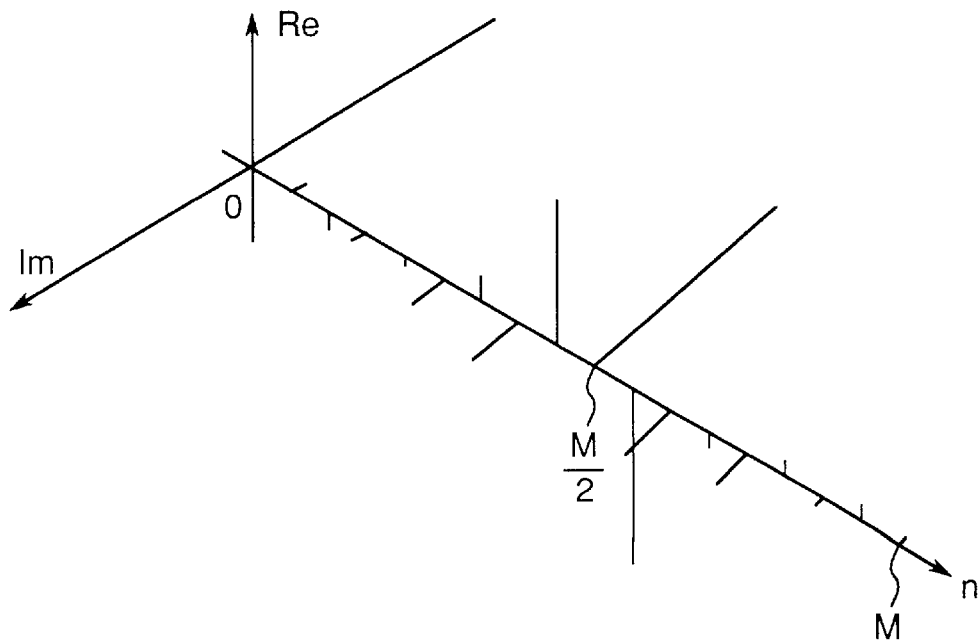
FIG. 11B is a timing chart showing a sampling signal obtained by an impulse response process of the NPF of the FIR type digital filter shown in FIG. 10 on a time base with respect to a complex plane.
Figure 12:
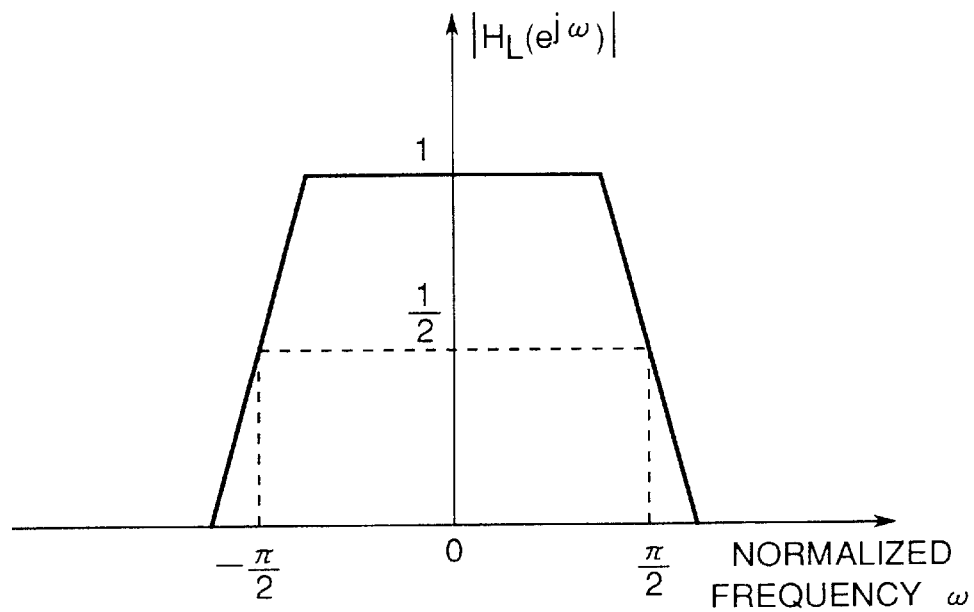
FIG. 12 is a chart showing an amplitude to frequency characteristic of a prior art low-pass filter (LPF)

In this case, since the filter coefficient h(m) is always a real number, a sampling signal obtained by the impulse response process of the LPF expressed on the time base is as shown in FIG. 11A. Next, as shown in FIG. 11B, the transfer function $H_N(z)$ of the NPF obtained by rotating the filter coefficient h(m) by −π/2 every time m advances by one in the complex plane can be expressed by the following equation:

$$H_N(z) = \sum_{m=0}^{M-1} \left( h(m) e^{-j(\frac{\pi}{2})m} \right) z^{-m} \quad (2)$$

According to the above equation (2), the relationship between the transfer function $H_L(z)$ of the LPF and the transfer function $H_N(z)$ of the NPF can be expressed by the following equation (3):

$$H_N(z) = \sum_{m=0}^{M-1} h(m) \left( e^{j(\frac{\pi}{2})} z \right)^{-m} \quad (3)$$
$$= H_L\left( e^{j(\frac{\pi}{2})} z \right)$$

Further, the transfer function $H_L(z)$ of the LPF and the transfer function $H_N(z)$ of the NPF can be related to each other in terms of their amplitude to frequency characteristics as expressed by the following equation:

$$|H_N(e^{j\omega})| = \left| H_L\left( e^{j\frac{\pi}{2}} \cdot e^{j\omega} \right) \right| = \left| H_L\left( e^{j(\omega + \frac{\pi}{2})} \right) \right| \quad (4)$$

As is understood from the above equation (4), it can be found that the NPF has an amplitude to frequency characteristic (shown in FIG. 13) obtained by shifting the amplitude to frequency characteristic of the LPF (shown in FIG.

Figure 13:
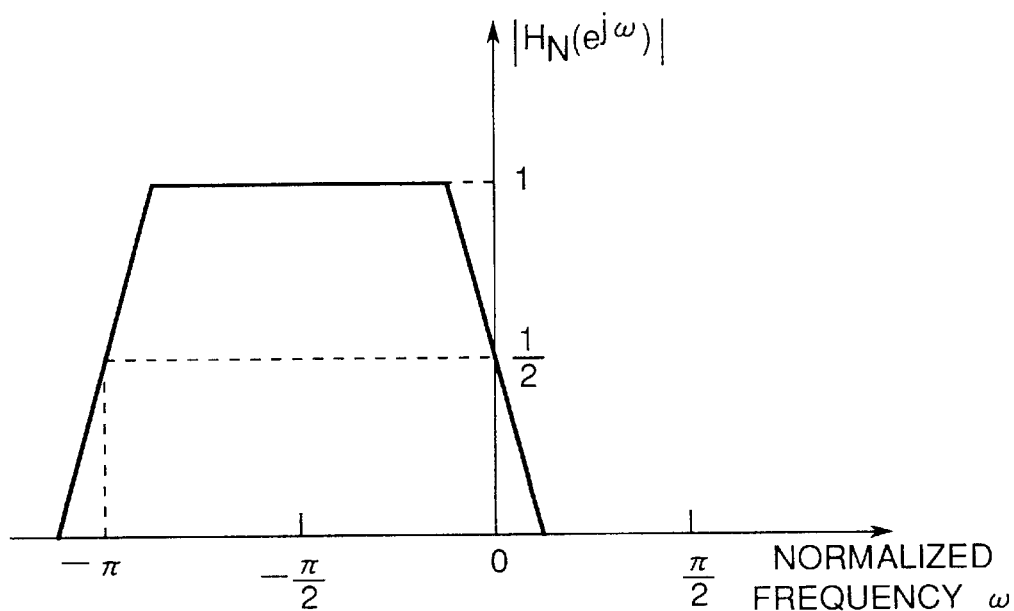
FIG. 13 is a chart showing an amplitude to frequency characteristic of the negative pass filter (NPF) used in the circuits shown in FIGS. 2 and 3.

12) by $\pi/2$ on the frequency axis in the direction of the negative frequency. Therefore, as shown in FIG. 13, the NPF has a 3-dB pass-band having a bandwidth of $\pi$ in the negative normalized frequency range of 0 to $-\pi$.

Figure 14:
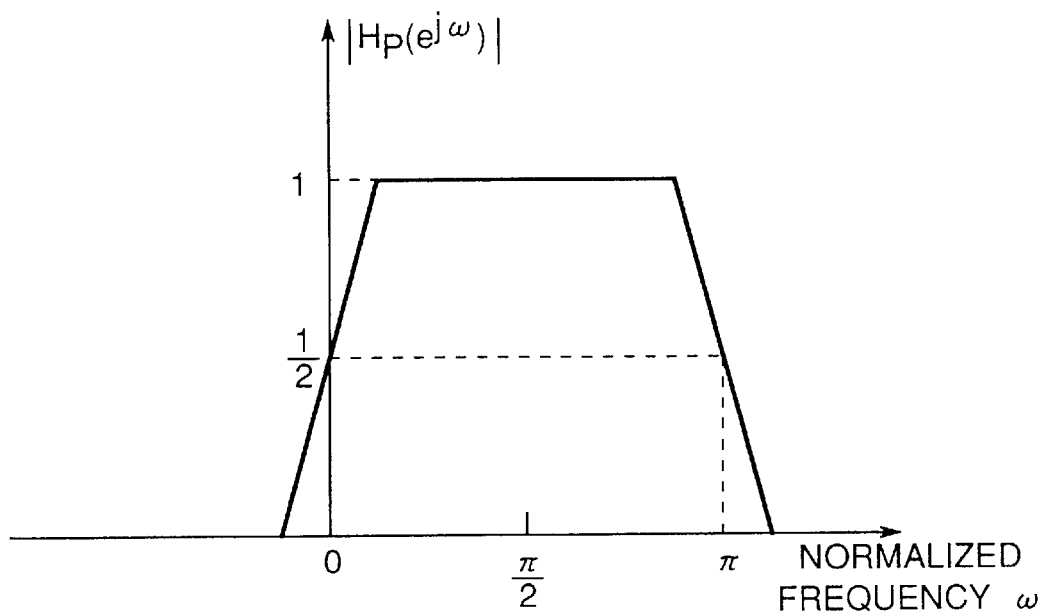
FIG. 14 is a chart showing an amplitude to frequency characteristic of the positive pass filter (PPF) used in the circuits shown in FIGS. 2 and 3.

In a manner similar to above, the transfer function $H_P(z)$ of the PPF formed by rotating the filter coefficient h(m) by $\pi/2$ in the complex plane every time m advances by one can be obtained by shifting the transfer function $H_L(z)$ of the LPF by $\pi/2$ on the frequency axis in the direction of the positive frequency, and this is shown in FIG. 14. Therefore, as is apparent from FIG. 14, the PPF has a 3-dB pass-band having a bandwidth of $\pi$ in the positive normalized frequency range of 0 to $\pi$.

An example of filter coefficients design when the PPFs and the NPFs having the number of stages M=12 are constituted using the FIR type digital filter shown in FIG. 10 is shown in Table 1 and Table 2.

TABLE 1

Filter coefficients h (M) of the PPF

| M | Re (h(M)) | Im (h(M)) |
|---|---|---|
| 0 | $-3.8096990 \times 10^{-3}$ | 0.0 |
| 1 | 0.0 | $1.8856590 \times 10^{-2}$ |
| 2 | $2.7103260 \times 10^{-3}$ | 0.0 |
| 3 | 0.0 | $8.4695940 \times 10^{-2}$ |
| 4 | $8.8469920 \times 10^{-2}$ | 0.0 |
| 5 | 0.0 | $4.8438940 \times 10^{-1}$ |
| 6 | $-4.843894 \times 10^{-1}$ | 0.0 |
| 7 | 0.0 | $-8.8469920 \times 10^{-2}$ |
| 8 | $-8.4695940 \times 10^{-2}$ | 0.0 |
| 9 | 0.0 | $-2.7103260 \times 10^{-3}$ |
| 10 | $-1.8856590 \times 10^{-2}$ | 0.0 |
| 11 | 0.0 | $3.8096990 \times 10^{-3}$ |

TABLE 2

Filter coefficients h (M) of NPF

| M | Re(h (M)) | Im (h(M)) |
|---|---|---|
| 0 | $-3.8096990 \times 10^{-3}$ | 0.0 |
| 1 | 0.0 | $-1.8856590 \times 10^{-2}$ |
| 2 | $2.7103260 \times 10^{-3}$ | 0.0 |
| 3 | 0.0 | $-8.4695940 \times 10^{-2}$ |
| 4 | $8.8469920 \times 10^{-2}$ | 0.0 |
| 5 | 0.0 | $-4.8438940 \times 10^{-1}$ |
| 6 | $-4.843894 \times 10^{-1}$ | 0.0 |
| 7 | 0.0 | $8.8469920 \times 10^{-2}$ |
| 8 | $-8.4695940 \times 10^{-2}$ | 0.0 |
| 9 | 0.0 | $2.7103260 \times 10^{-3}$ |
| 10 | $-1.8856590 \times 10^{-2}$ | 0.0 |
| 11 | 0.0 | $-3.8096990 \times 10^{-3}$ |

THEORY OF DSC

Downsampling is also called decimation, and the DSC is a circuit for reducing the sampling rate. A decimation coefficient Md represents a rate of decimating (i.e., thinning) a sampling signal, and is also called a level Md. Md is a natural number equal to or larger than two. Further, assuming that a series of inputted signal is x(n) and a series of output signal is y(n), then the relationship between the series of inputted signal x(n) and the series of output signal y(n) is expressed by the following equation:

$$y(n) = x(Md \cdot n), \quad n=1, 2, 3, \ldots \quad (5)$$

Figure 15A:
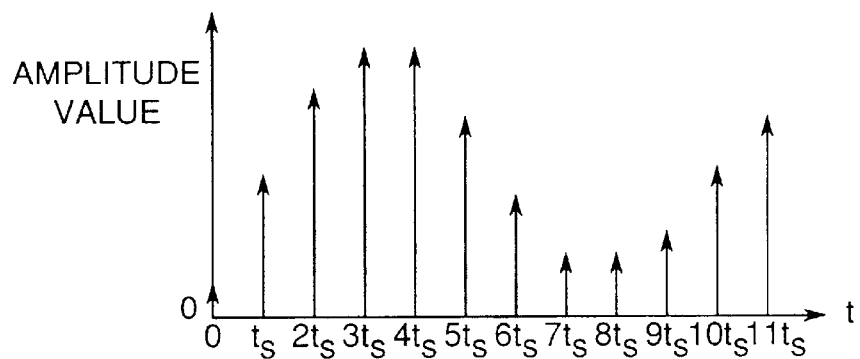
FIG. 15A is a timing chart showing on a time base a sampling signal before being processed by each of downsampling converters (DSCs) shown in FIGS. 2 and 3.
Figure 15B:
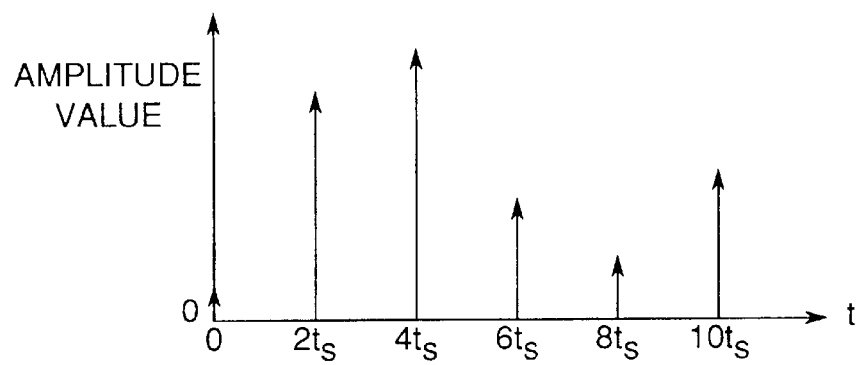
FIG. 15B is a timing chart showing on a time base a sampling signal which has been processed by each of the downsampling converters (DSCs) shown in FIGS. 2 and 3.

The downsampling process with Md=2 is shown in FIGS. 15A and 15B. As is understood from FIGS. 15A and 15B, by sampling the series of inputted signal x(n) at intervals of two, or every other one, the series of down-sampled output signal y(n) can be obtained. In FIGS. 15A and 15B, ts is a sampling period of the series of inputted signal x(n).

AMPLITUDE TO FREQUENCY CHARACTERISTIC IN DOWNSAMPLING PROCESS

The relationship between the amplitude to frequency characteristics $X(e^{j\omega})$ and $Y(e^{j\omega})$ of the series of inputted signal x(n) and the series of output signal y(n) of the DSC is obtained as follows. In order to derive this relational expression, a series of signal x'(n) is pre-defined as follows:

$$x'(n) = x(n), \text{ for } n=0, \text{ Md}, 2\text{Md}, 3\text{Md}, \ldots =0, \text{ for the other cases} \quad (6)$$

The series of signal x'(n) corresponds to one obtained by multiplying x(n) by the impulse train of the period Md. That is, the series of signal x'(n) can be expressed by the following equation:

$$x'(n) = x(n) \left[ \frac{1}{Md} \sum_{l=0}^{Md-1} e^{j\frac{2\pi ln}{Md}} \right] \quad (7)$$

The inside of the brackets [ ] at the right member of the equation (7) is indicated in a form of a Fourier series of the impulse train of the period Md. We use Q for the inside of the brackets [ ] at the right member of the equation (7). This can be confirmed as follows. When n is not an integral multiple of the period Md, Q can be expressed by the following equation:

$$Q = \frac{1}{Md} \sum_{l=0}^{Md-1} e^{j\frac{2\pi ln}{Md}} \quad (8)$$

$$= \frac{1}{Md} \left\{ 1 - \left(e^{j\frac{2\pi n}{Md}}\right)^{Md} \right\} \Big/ \left(1 - e^{j\frac{2\pi n}{Md}}\right)$$

$$= (1-1) \Big/ \left\{ Md\left(1 - e^{j\frac{2\pi n}{Md}}\right) \right\}$$

$$= 0$$

When n is an integral multiple of Md, Q is expressed by the following equation:

$$Q = \frac{1}{Md} \sum_{l=0}^{Md-1} e^{j\frac{2\pi ln}{Md}} \quad (9)$$

$$= \frac{1}{Md} \sum_{l=0}^{Md-1} 1$$

$$= \frac{Md}{Md}$$

$$= 1$$

When a series of output signal y(m) is subjected to Z transformation based on the above preparation, y(m) is expressed by the following equation:

$$y(m) = x(Md \cdot m) = x'(Md \cdot m) \quad (10)$$

Therefore, $$Y(z) = \sum_{m=-\infty}^{\infty} y(m)z^{-m} \quad (11)$$

$$= \sum_{m=-\infty}^{\infty} x'(Md \cdot m)z^{-m}$$

In this case, since x'(m) is zero except for the integral multiple of the period Md, there can be provided the following equation:

$$Y(z) = \sum_{m=-\infty}^{\infty} x'(m)z^{-\frac{m}{Md}} \quad (12)$$

$$= \frac{1}{Md} \sum_{m=-\infty}^{\infty} \left[ \sum_{l=0}^{Md-1} x(m) e^{\frac{j2\pi l n}{Md}} z^{-\frac{m}{Md}} \right]$$

$$= \frac{1}{Md} \sum_{l=0}^{Md-1} \left[ \sum_{m=-\infty}^{\infty} x(m) \left( e^{-\frac{j2\pi l}{Md}} \cdot z^{\frac{1}{Md}} \right)^{-m} \right]$$

$$= \frac{1}{Md} \sum_{l=0}^{Md-1} X\left( e^{-\frac{j2\pi l}{Md}} \cdot z^{\frac{1}{Md}} \right)$$

From the above equations, the following equation can be obtained:

$$Y(z) = \frac{1}{Md} \sum_{l=0}^{Md-1} X\left( z^{\frac{1}{Md}} \cdot W^l \right) \quad (13)$$

where $$W = e^{-\frac{j2\pi}{Md}} \quad (14)$$

Although the downsampling process generally has the characteristic as expressed by the equation (13), for simplicity, we consider the characteristic with Md=2. If two is substituted into Md in the above equation (13), there is obtained the following equation:

$$Y(z) = \frac{1}{2} \sum_{l=0}^{l} X\left( e^{-\frac{j2\pi l}{Md}} \cdot z^{\frac{1}{Md}} \right) \quad (15)$$

$$= \frac{1}{2} \cdot X\left( z^{\frac{1}{2}} \right) + \left( \frac{1}{2} \right) \cdot X\left( e^{-j\pi} \cdot z^{\frac{1}{2}} \right)$$

Figure 16A:
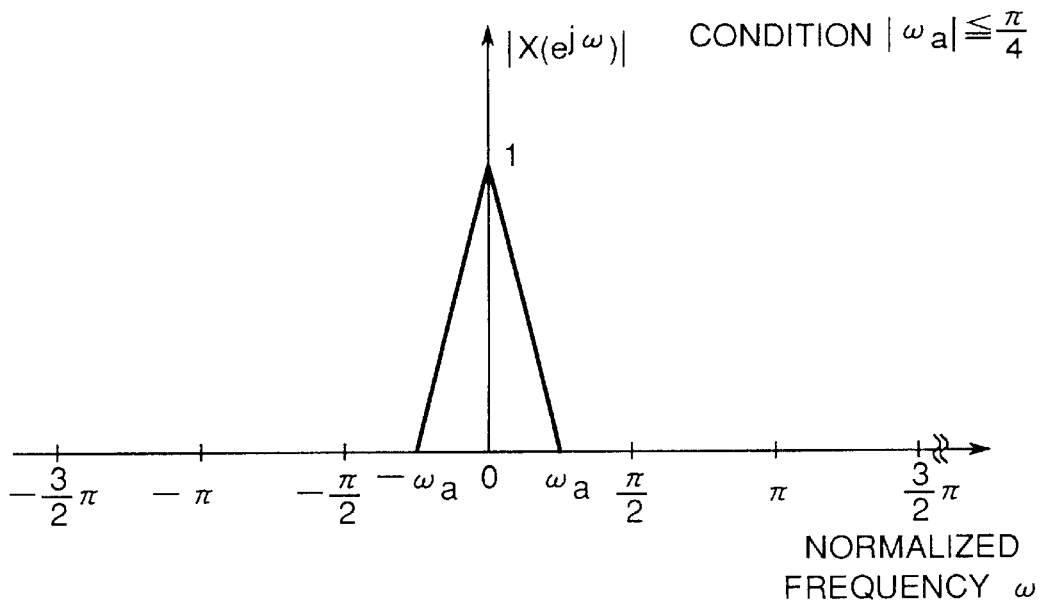
FIG. 16A is an amplitude to frequency characteristic chart showing a signal before being processed by each of the downsampling converters (DSCs) shown in FIGS. 2 and 3.
Figure 16B:
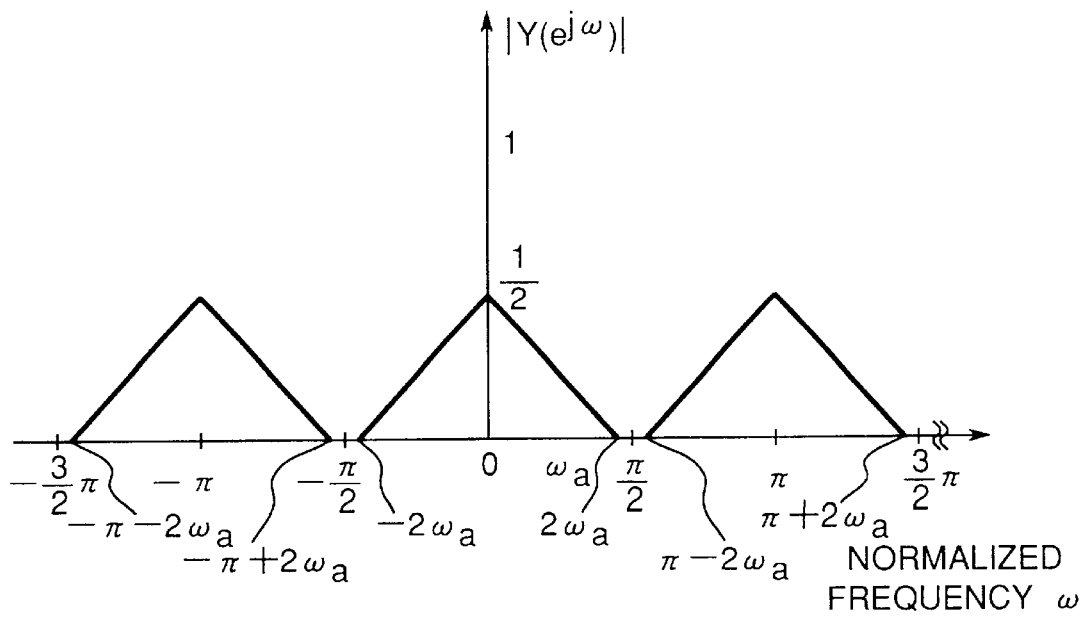
FIG. 16B is an amplitude to frequency characteristic chart showing a signal which has been processed by each of the downsampling converters (DSCs) with Md=2 which are shown in FIGS. 2 and 3.

The right member of the equation (15) is separated into two terms, and respective terms have significant meanings. That is, in regard to the amplitude to frequency characteristic of the first term $\{(\frac{1}{2}) \times (z^{1/2})\}$ of the right member of the equation (15), the amplitude thereof is one half of that of the original X(z) and the bandwidth thereof is two times as great as that of the original X(z). Further, in regard to the amplitude to frequency characteristic of the second term $\{(\frac{1}{2})(e^{-j\pi} \cdot z^{1/2})\}$ of the right member of the equation (15), it can be found that the term has a foldedly repeated characteristic in which the expression of the first term is further repetitively shifted $\pm\pi$ by $\pm\pi$ on the frequency axis to be continuously foldedly repeated idealistically infinitely. Taking the above fact into consideration, the amplitude to frequency characteristic of Y(z) obtained by subjecting the X(z) shown in FIG. 16A to the downsampling process with Md=2 becomes a characteristic as shown in FIG. 16B. It is to be noted that the range of the spectrum is changed from $[0, 2\pi]$ to $[-\pi, \pi]$.

That is, the resultant obtained by the downsampling process has such a foldedly repeating characteristic whose amplitude becomes one half of that of the original X(z), and whose bandwidth becomes two times as great as that of the original X(z) and which is repetitively shifted $\pm\pi$ by $\pm\pi$ on the frequency axis. In this case, when the frequency band of the inputted signal is under a condition of $|\omega_a| \leq \pi/4$, the respective bands of the foldedly repeated characteristic do not overlap one another even after the downsampling process.

The channel separating filter bank 10 illustrated in FIGS. 1 to 3 is constituted by the PPFs, the NPFs and the DSCs which are described as above in detail.

Next, a new theory for allowing the demodulator 11 shown in FIG. 4 to be constituted by the PPFs, the NPFs and the DSCs in a manner similar to that of the channel separating filter bank 10 will be described below.

Figure 17:
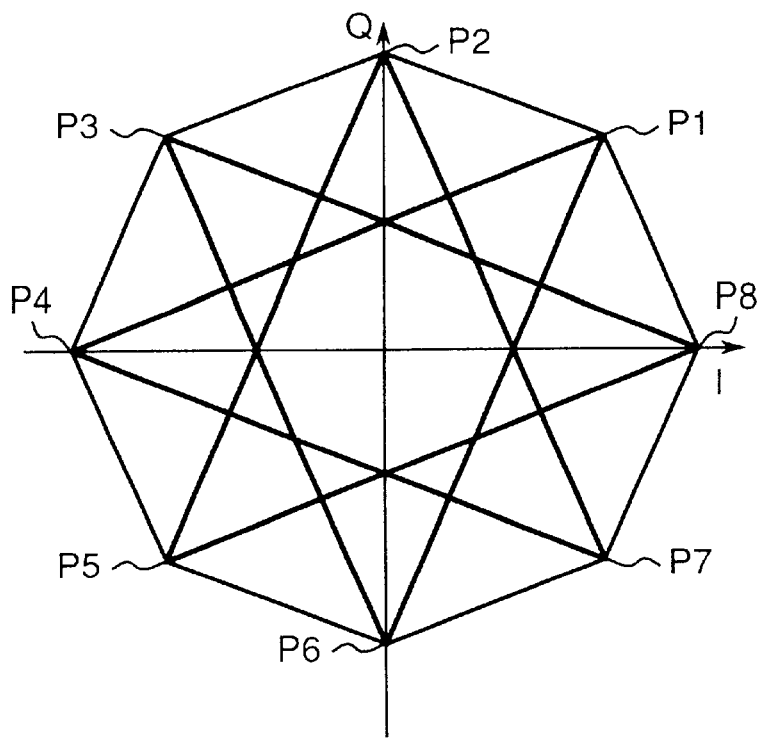
FIG. 17 is a signal space diagram showing a π/4-shift QPSK-modulated signal used in the receiver apparatus shown in FIG. 1.

FIG. 17 shows a diagram of a $\pi/4$-shift QPSK-modulated signal space used in, for example, a PHS system. As is apparent from FIG. 17, eight signal points P1 to P8 which are shifted by $\pi/4$ from one another on an identical amplitude circle are included.

Figure 18:
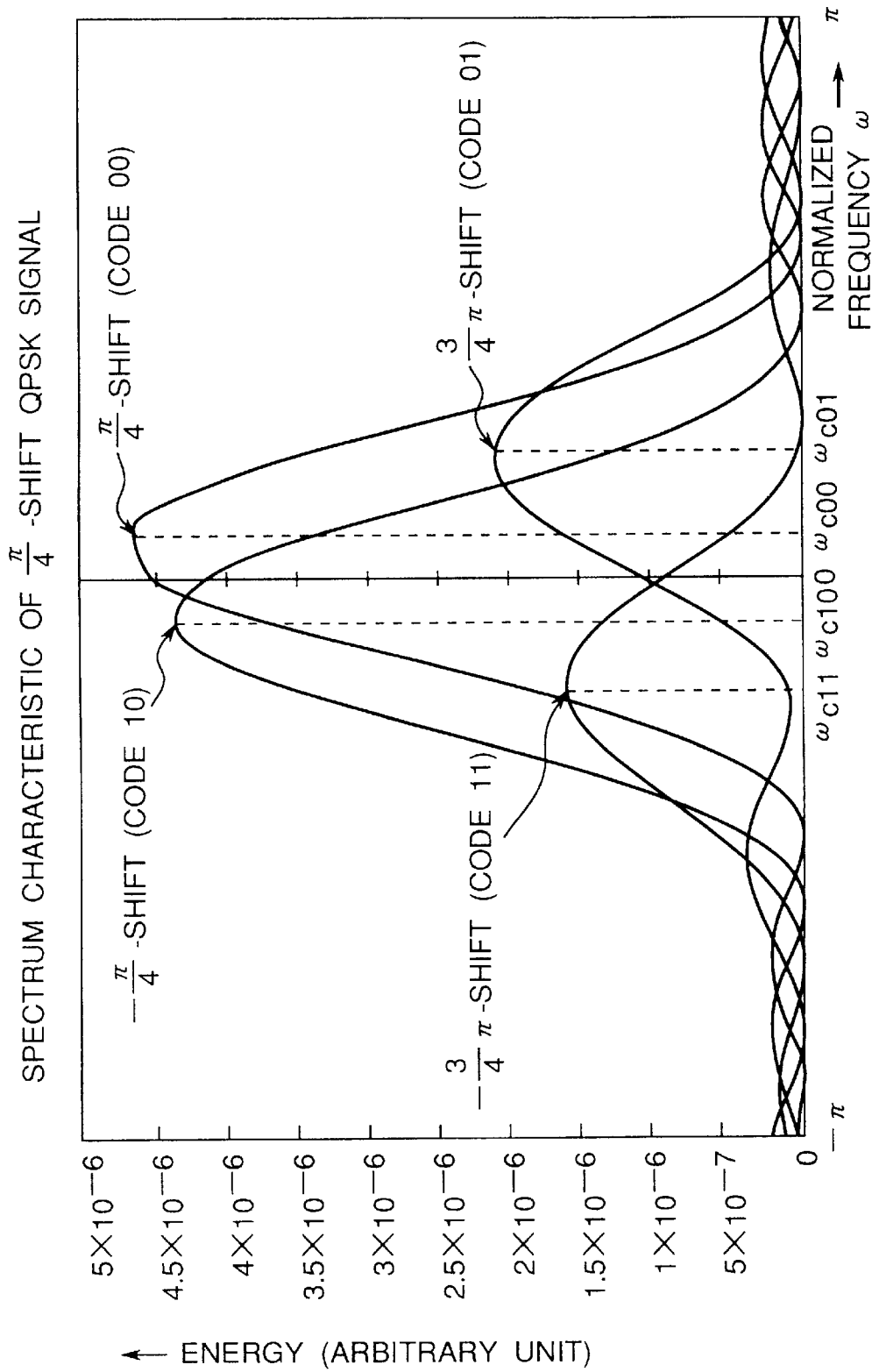
FIG. 18 is a chart showing a spectrum characteristic of a π/4-shift QPSK-modulated signal used in the receiver apparatus shown in FIG. 1.
Figure 20A:
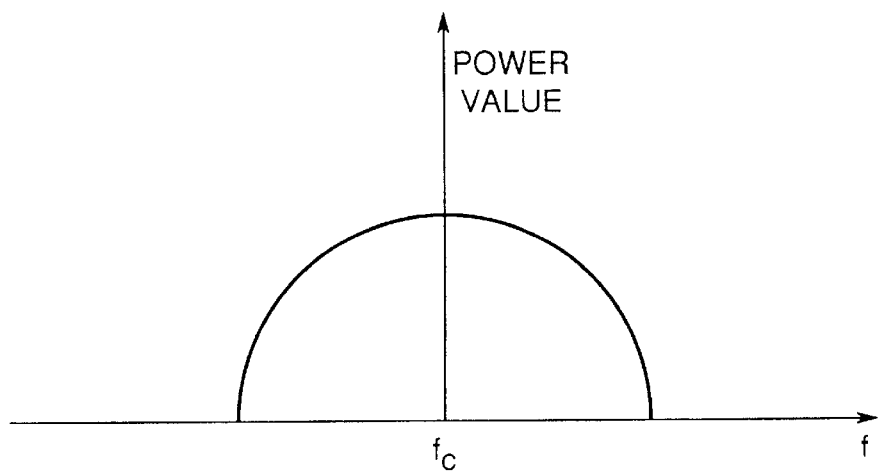
FIG. 20A is a frequency characteristic chart of a prior art TDMA-TDD system.
Figure 20B:
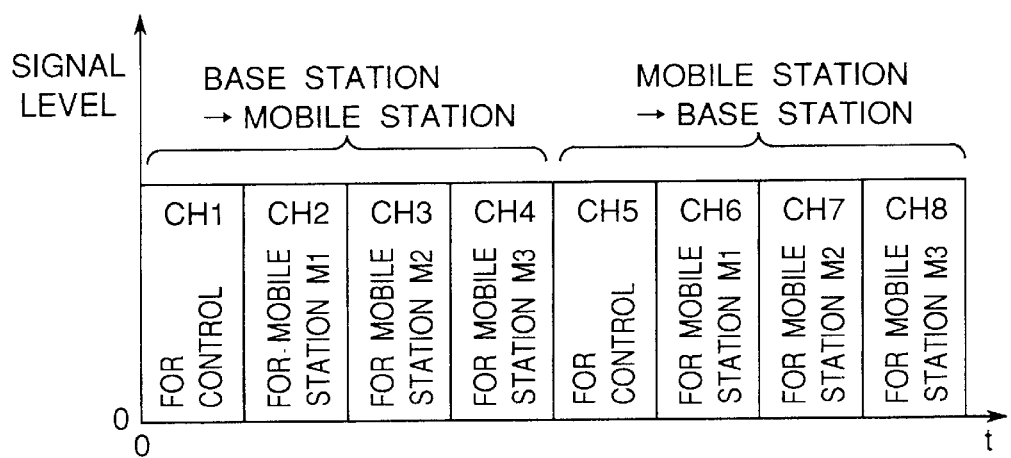
FIG. 20B is a timing chart showing a time division multiplex format of the prior art TDMA-TDD system.
Figure 21A:
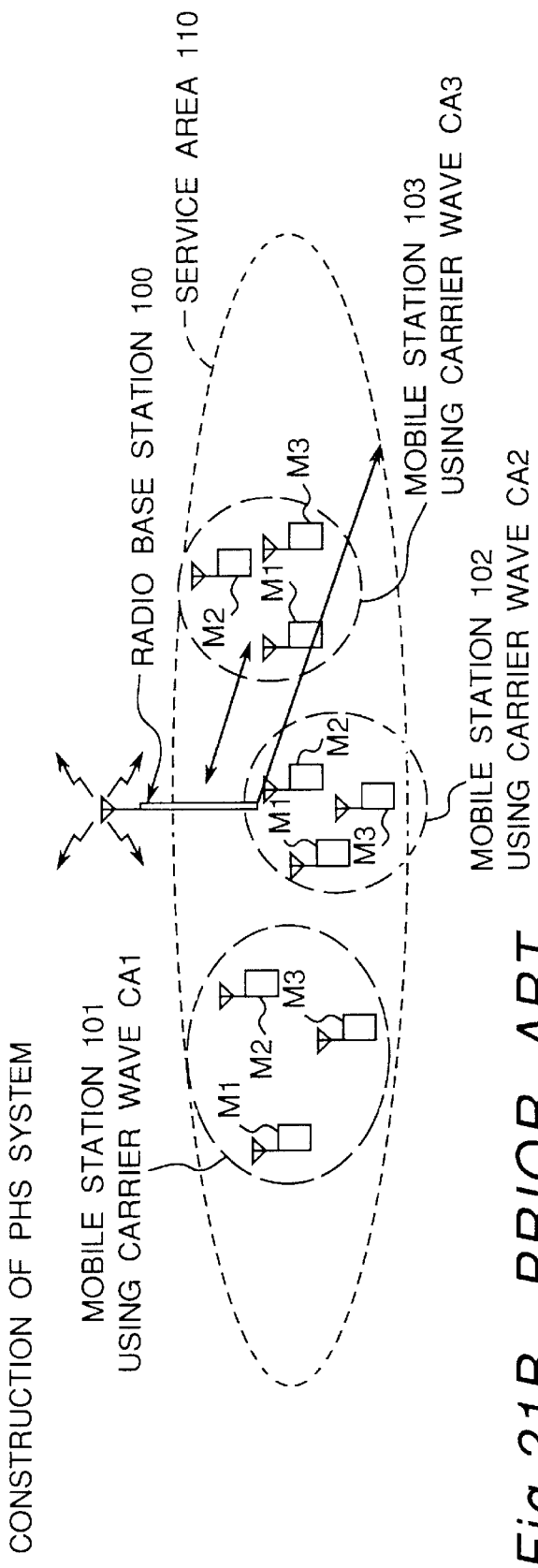
FIG. 21A is a appearance view showing a system construction of a prior art PHS system.
Figure 21B:
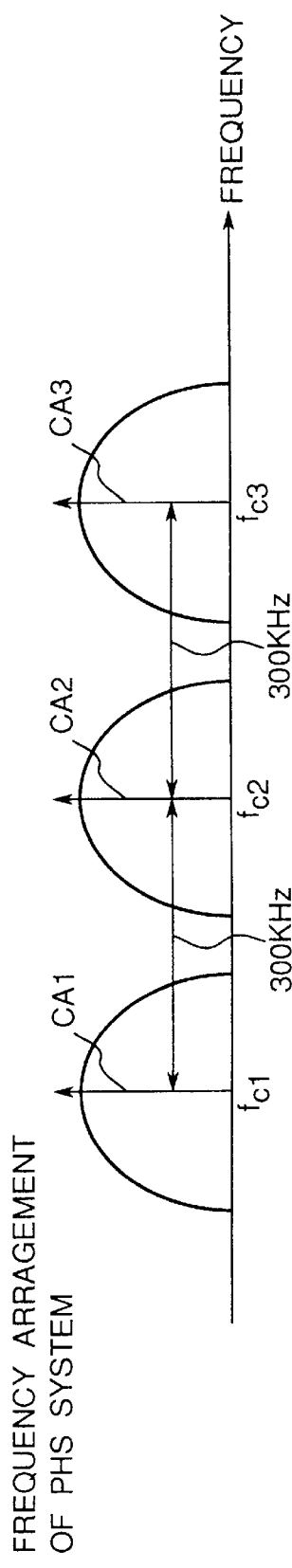
FIG. 21B is an amplitude to frequency characteristic chart showing a frequency arrangement of the prior art PHS system.

FIG. 18 shows a spectrum characteristic of the $\pi/4$-shift QPSK-modulated signal. As is apparent from FIG. 18, the peak of energy of the modulated signal changes according to four modulated codes of QPSK, and it can be found that the codes can be uniquely determined by detecting the frequency at the peak at which the signal exists. This can be schematically illustrated in FIG. 19. and it is to be noted that the amplitude value thereof may be incorrect in FIG. 19.

As shown in FIG. 19, it can be found that the peak of a code 00 is located at a positive normalized frequency $\omega_{c00}$, the peak of a code 01 is located at a positive normalized frequency $\omega_{c01}$ ($>\omega_{c00}$), the peak of a code 10 is located at a negative normalized frequency $\omega_{c10}$ and the peak of a code 11 is located at a negative normalized frequency $\omega_{c11}$ ($<\omega_{c10}$) within the normalized frequency range of $-\pi$ to $+\pi$ on the normalized $\omega/2\pi$. In this case, only one peak exists for each code at a predetermined time. That is, by detecting the normalized frequency of the peak of each code, the QPSK-modulated signal can be demodulated. In the present preferred embodiment, the demodulator 11 is constituted by the PPFs, the NPFs and the DSCs in a manner similar to that of the channel separating filter bank 10.

CONSTRUCTION AND OPERATION OF QPSK RECEIVER APPARATUS

Figure 5A:
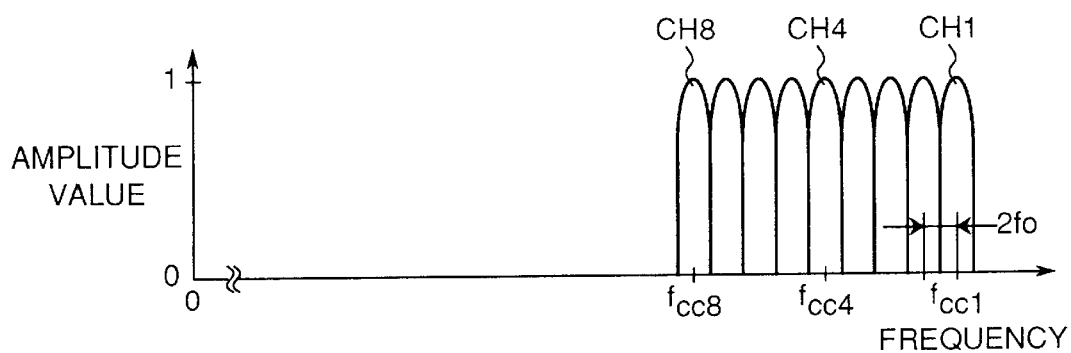

A construction and an operation of a $\pi/4$-shift QPSK receiver apparatus provided with the channel separating filter bank 10 and the demodulator 11 according to one preferred embodiment of the present invention will be described with reference to FIG. 1. According to the present preferred embodiment, in the radio system shown in FIG. 5A, communication is executed by means of radio signals of eight channels CH1 to CH8 arranged side by side on the frequency axis mutually at channel intervals of $2f_0$. That is, the signals of the eight channels are a group of frequency-division-multiplexed signals, and all the signals of the eight channels are not always required to exist. In this case, it is assumed that the carrier wave frequency of the channel CH1 is $f_{cc1}$, and likewise, the carrier wave frequency of the channel CHm is $f_{ccm}$ for m=2, 3, 4, 5, 6, 7 and 8. In FIG. 5A and subsequent FIGS., the interval between the band of one channel and the band of the adjacent channel is assumed to be 0. However, when actually constructing a radio system, it is necessary to set a margin frequency between the adjacent two channels.

Figure 5B:
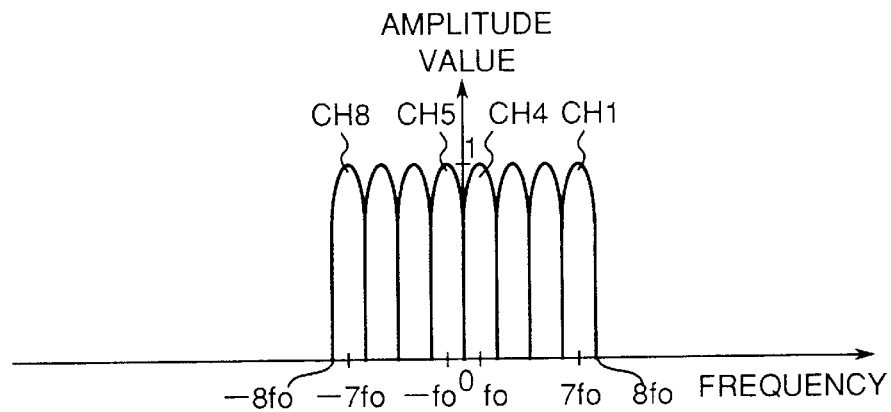

Referring to FIG. 1, a transmission radio signal of the π/4-shift QPSK-modulated signal transmitted from the antenna of the transmitter of the other party is received by an antenna 1, and then, the received signal is outputted to a distributor 3 via a high-frequency amplifier 2 which passes therethrough and amplifies only the signals of all the bands of the eight channels CH1 to CH8. In this case, the QPSK-modulated signal is a signal obtained by QPSK-modulating a carrier wave signal according to a parallel 2-bit data signal inputted to the transmitter. The distributor 3 distributes the inputted signal into two signals, then outputs one distributed signal to a mixer 4a and outputs another distributed signal to a mixer 4b. A local oscillator 5 generates a local oscillation signal having a local oscillation frequency of $\{(f_{cc4}+f_{cc5})/2\}$, then outputs the local oscillation signal to the mixer 4a and outputs the same local oscillation signal to the mixer 4b via a π/2 phase shifter 6 for shifting the inputted signal by π/2. The mixer 4a mixes the inputted two signals through multiplication, and outputs the signal obtained by the mixing to an A/D converter 8a via an LPF 7a for passing therethrough a frequency not higher than a frequency of $8f_0$. On the other hand, the mixer 4b similarly mixes the inputted two signals through multiplication, and outputs the signal obtained by the mixing to an A/D converter 8b via an LPF 7b for passing therethrough a frequency not higher than the frequency of $8f_0$. Consequently, the two signals distributed by the distributor 3 are frequency-converted by a frequency converter 12 that is comprised of the mixers 4a and 4b and the LPFs 7a and 7b so that the average frequency of the carrier wave frequency $f_{cc4}$ of channel CH4 and the carrier wave frequency $f_{cc5}$ of channel CH5 becomes a frequency of zero, namely, so that the signal components of the channels CH1 to CH4 exist in the positive frequency region and the signal components of the channels CH5 to CH8 exist in the negative frequency region, as shown in FIG. 5B.

The A/D converters 8a and 8b A/D convert the inputted analog signals into digital signal data with a predetermined sampling rate and output an I-channel data signal and a Q-channel data signal, which are orthogonal to each other, to the channel separating filter bank 10. As described in detail later, the channel separating filter bank 10 subjects the data signals of the eight channels to a frequency separation process every channel, i.e., executes a channel separation process, so as to output the I-channel data signal and the Q-channel data signal of the channel CH1 to a demodulator 11-1. Likewise, the channel separating filter bank 10 outputs the I-channel data signal and the Q-channel data signal of the channel CHm to the demodulator 11-m (m=2, 3, . . . , 8). In response to this, the demodulator 11-m (m=1, 2, . . . , m; and the demodulator 11-1 to 11-8 generally denoted by a reference numeral 11) QPSK-demodulates the inputted signal so as to generate and output generated QPSK demodulated data signal.

CONSTRUCTION OF CHANNEL SEPARATING FILTER BANK

A construction of the channel separating filter bank 10 shown in FIG. 1 will be described with reference to FIGS. 2 and 3. It is to be noted that the reference numeral 2 provided on each signal line in FIGS. 2 to 4 means that the signal flowing through the signal line is a complex number signal which represents the I-channel data signal of the real number portion thereof and the Q-channel data signal of the imaginary number portion thereof which are orthogonal to each other. The channel separating filter bank 10 is comprised of filter banks 10a, 10b and 10c of the first to third stages, respectively. The filter bank 10a, 10b or 10c of each stage is comprised of a pair or a plurality of pairs of PPF and NPF, a DSC for downsampling the output signal from the PPF, and another DSC for downsampling the output signal from the NPF.

In this case, the PPFs 101, 201, 221, 301, 321, 341 and 361 have identical specifications, i.e., an identical positive pass-band from 0 to $8f_0$, and each of the PPFs 101, 201, 221, 301, 321, 341 and 361 band-pass-filters and outputs only the signal component of the positive pass-band of the inputted complex number data signals. The NPFs 111, 211, 231, 311, 331, 351 and 371 have identical specifications, i.e., an identical negative pass-band from 0 to $-8f_0$, and each of the NPFs 111, 211, 231, 311, 331, 351 and 371 band-pass-filters and outputs only the signal component of the negative pass-band of the inputted complex number data signals. Further, the DSCs 102, 112, 202, 212, 222, 232, 302, 312, 322, 332, 342, 352, 362 and 372 have identical specifications, and each of the DSCs 102, 112, 202, 212, 222, 232, 302, 312, 322, 332, 342, 352, 362 and 372 subjects the inputted complex number data signals to the downsampling process with Md=2 so as to output the processed signals. In this case, in the downsampling process with Md=2, as described in detail later, by downsampling the inputted data signals every other one, the outputted data signal has the followings:

(a) an amplitude which is one half of that of the inputted data signal;

(b) a bandwidth which is two times as great as that of the inputted data signal; and (c) a spectrum which is obtained when the doubled spectrum of the inputted signal is repeatedly shifted by $\pm 16f_0$.

Referring to FIG. 2, the I-channel data signal outputted from the A/D converter 8a is inputted to the PPF 101 and the NPF 111 of the filter bank 10a of the first stage, while the Q-channel data signal outputted from the A/D converter 8b is inputted to the PPF 101 and the NPF 111 of the filter bank 10a of the first stage.

In the filter bank of the first stage, a complex number data signal outputted from the PPF 101 is inputted via the DSC 102 to the PPF 201 and the NPF 211 of the filter bank 10b of the second stage, while a complex number data signal outputted from the NPF 111 is inputted via the DSC 112 to the PPF 221 and the NPF 231 of the filter bank 10b of the second stage.

Therefore, an output data signal from the PPF 101 has a band signal component of the channels CH1 to CH4 having a positive frequency band of 0 to $8f_0$ as shown in FIG. 6A, while an output data signal from the DSC 102 of the next stage has a spectrum in which the band signal component of the channels CH1 to CH4 having a positive frequency band of 0 to $16f_0$ is repeatedly shifted by $\pm 16f_0$ as shown in FIG. 6C. On the other hand, an output data signal from the NPF 111 has a band signal component of the channels CH5 to CH8 having a negative frequency band of 0 to $-8f_0$ as shown in FIG. 6B, and an output data signal from the DSC 112 of the next stage has a spectrum in which the band signal component of the channels CH5 to CH8 having a negative frequency band of 0 to $-16f_0$ is repeatedly shifted by $\pm 16f_0$ as shown in FIG. 6D.

In the filter bank 10b of the second stage, a complex number data signal outputted from the PPF 201 is inputted via the DSC 202 to the PPF 301 and the NPF 311 of the filter bank 10c of the third stage, while a complex number data signal outputted from the NPF 211 is inputted via the DSC 212 to the PPF 321 and the NPF 331 of the filter bank 10c of the third stage. Further, a complex number data signal outputted from the PPF 221 is inputted via the DSC 222 to the PPF 341 and the NPF 351 of the filter bank 10c of the third stage, while a complex number data signal outputted from the NPF 231 is inputted via the DSC 232 to the PPF 361 and the NPF 371 of the filter bank 10c of the third stage.

Therefore, for example, the output data signal from the PPF 201 has a band signal component of the channels CH3 and CH4 having the positive frequency band of 0 to $8f_0$ as shown in FIG. 7A, and an output data signal from the DSC 202 of the next stage has a spectrum in which the band signal component of the channels CH3 and CH4 having the positive frequency band of 0 to $16f_0$ is repeatedly shifted by $\pm 16f_0$ as shown in FIG. 7C. Further, for example, an output data signal from the NPF 211 has a band signal component of the channels CH1 and CH2 having the negative frequency band of 0 to $-8f_0$ as shown in FIG. 7B, and an output data signal from the DSC 212 of the next stage has a spectrum in which the band signal component of the channels CH1 and CH2 having the negative frequency band of 0 to $-16f_0$ is repeatedly shifted by $\pm 16f_0$ as shown in FIG. 7D.

In the filter bank 10c of the third stage, a complex number data signal outputted from the PPF 301 is outputted via the DSC 302, so that only the data signal of the channel CH4 is band-pass-filtered to be extracted and thereafter outputted to the demodulator 11-4. Further, a complex number data signal outputted from the NPF 311 is outputted via the DSC 312, so that only the data signal of the channel CH3 is band-pass-filtered to be extracted and thereafter outputted to the demodulator 11-3.

A complex number data signal outputted from the PPF 321 is outputted via the DSC 322, so that only the data signal of the channel CH2 is band-pass-filtered to be extracted and thereafter outputted to the demodulator 11-2. Further, a complex number data signal outputted from the NPF 331 is outputted via the DSC 332, so that only the data signal of the channel CH1 is band-pass-filtered to be extracted and thereafter outputted to the demodulator 11-1.

A complex number data signal outputted from the PPF 341 is outputted via the DSC 342, so that only the data signal of the channel CH8 is band-pass-filtered to be extracted and thereafter outputted to the demodulator 11-8. Further, a complex number data signal outputted from the NPF 351 is outputted via the DSC 352, so that the data signal of the channel CH7 is band-pass-filtered to be extracted and thereafter outputted to the demodulator 11-7.

A complex number data signal outputted from the PPF 361 is outputted via the DSC 362, so that only the data signal of the channel CH6 is band-pass-filtered to be extracted and thereafter outputted to the demodulator 11-6. Further, a complex number data signal outputted from the NPF 371 is outputted via the DSC 372, so that the data signal of the channel CH5 is band-pass-filtered to be extracted and thereafter outputted to the demodulator 11-5.

Figure 8A:
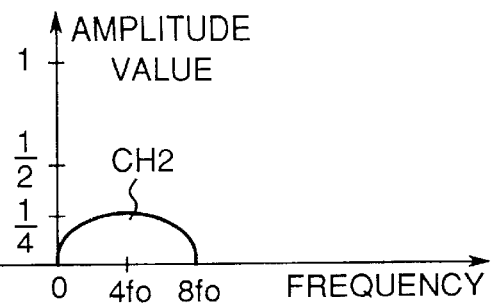
Figure 8B:
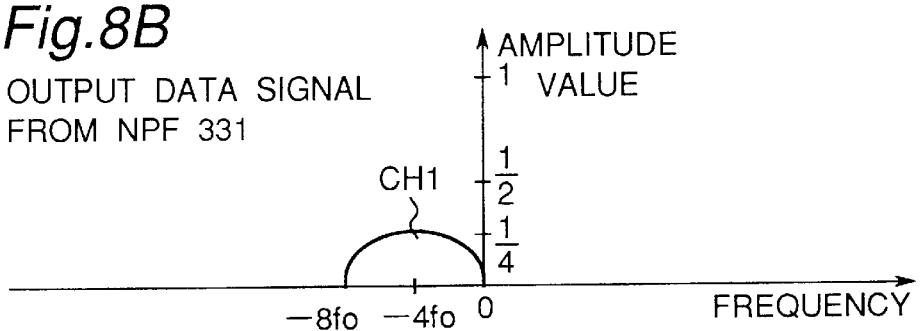
Figure 8C:
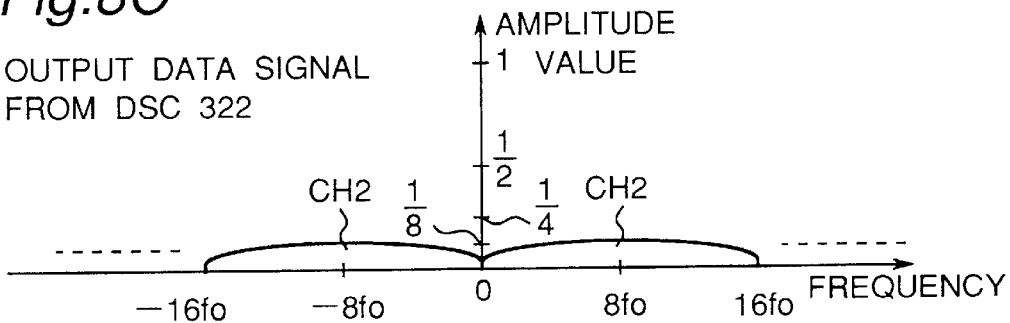
Figure 8D:
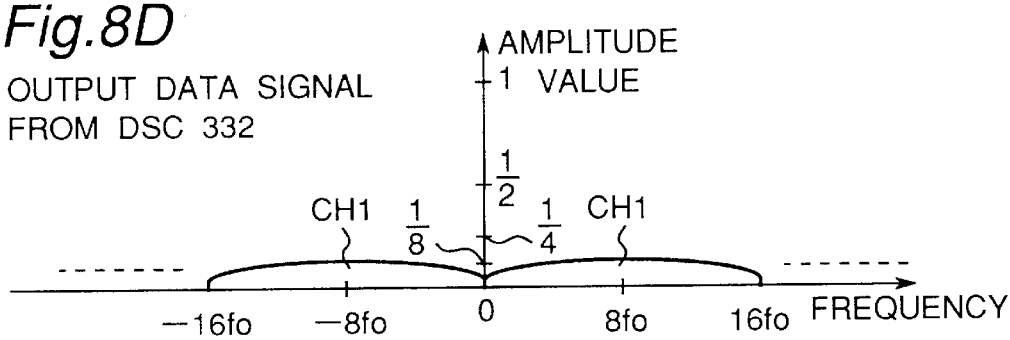

Therefore, for example, an output data signal from the PPF 321 has a band signal component of the channel CH2 having the positive frequency band of 0 to $8f_0$ as shown in FIG. 8A, and an output data signal from the DSC 322 of the next stage has a spectrum in which the band signal component of the channel CH2 having the positive frequency band of 0 to $16f_0$ is repeatedly shifted by $\pm 16f_0$ as shown in FIG. 8C. Further, for example, an output data signal from the NPF 331 has a band signal component of the channel CH1 having the negative frequency band of 0 to $-8f_0$ as shown in FIG. 8B, and an output data signal from the DSC 332 of the next stage has a spectrum in which the band signal component of the channel CH1 having the negative frequency band of 0 to $-16f_0$ is repeatedly shifted by $\pm 16f_0$ as shown in FIG. 8D.

The data signal components of the other channels are processed in a manner similar to those of above, so that only the band signal components of the channel CHm are outputted from the DSCs 302, 312, 322, 332, 342, 352, 362 and 372 to the demodulator 11-m (m=1, 2, . . . , 8).

In FIG. 3, level detectors 103, 113, 203, 213, 223, 233, 303, 313, 323, 333, 343, 353, 363 and 373 have an identical construction, and each of the level detectors 103, 113, 203, 213, 223, 233, 303, 313, 323, 333, 343, 353, 363 and 373 calculates an amplitude value of the inputted complex number signal, and then outputs a resultant signal having the calculated amplitude value as a signal level signal. The data signals outputted from the DSCs 102, 112, 202, 212, 222, 232, 302, 312, 322, 332, 342, 352, 362 and 372 are inputted to the level detectors 103, 113, 203, 213, 223, 233, 303, 313, 323, 333, 343, 353, 363 and 373, respectively. The signal level signals outputted from the level detectors 103, 113, 203, 213, 223, 233, 303, 313, 323, 333, 343, 353, 363 and 373 are inputted to a filter bank controller 100. In response to this, in a state in which a signal level signal becomes zero (i.e., no signal exists, and this means "turning off"), the filter bank controller 100 disables the operation of the circuit subsequent to the DSC which has detected this state, with a disable control signal, so as to stop the operation thereof, and makes the code of the demodulated data signal outputted from the corresponding demodulator 11 "00". This code 00 may be a further predetermined code. By the operation with the disable control signal, a supply power current to the circuit subsequent to the DSC which has detected this state is made zero, thereby allowing the consumption current flowing in the channel separating filter bank 10 to be saved.

In the above-mentioned channel separating filter bank 10 of the present preferred embodiment, a filter bank having three stages has been described. However, the present invention is not limited to this, and a filter bank having one stage, two stages or four and more stages may be constituted. When constructing a filter bank with a filter pair of PPF and NPF, a filter bank having n stages can separate a frequency-multiplexed signal into $2^n$ channels. By eliminating one of the PPF and the NPF in the second and subsequent stages, an arbitrary plural number of channels other than $2^n$ channels can be separated.

In the channel separating filter bank 10 of the above preferred embodiment, the channel separating filter bank 10 for the QPSK modulated signal has been described. However, the present invention is not limited to this, and the filter bank 10 can be used for separating a further modulated signal comprised of channel signals, such as an FSK signal, a QAM signal, a non-modulated signal such as a carrier wave signal, or the like, into a plurality of channels.

CONSTRUCTION OF DEMODULATOR 11

A construction of the demodulator 11-1 to 11-8 shown in FIG. 1 will be described with reference to FIG. 4. Since the demodulator 11-1 to 11-8 have an identical construction, one demodulator 11 will be described below.

Referring to FIG. 4, the demodulator 11 is comprised of a frequency converting section 11a and a signal demodulating section 11b.

Figure 9A:
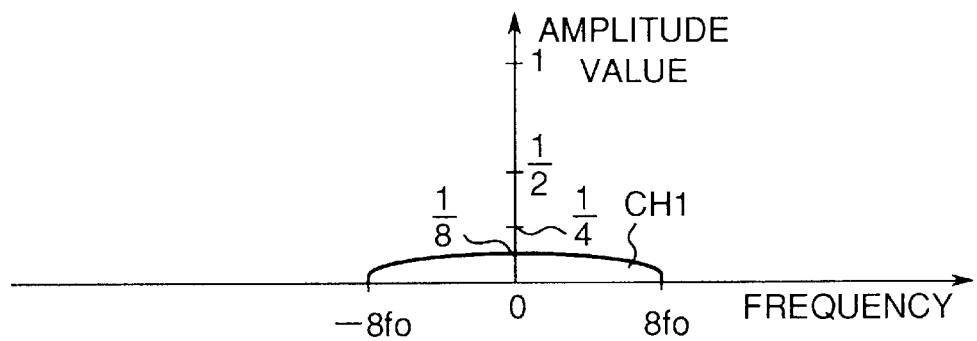
Figure 9B:
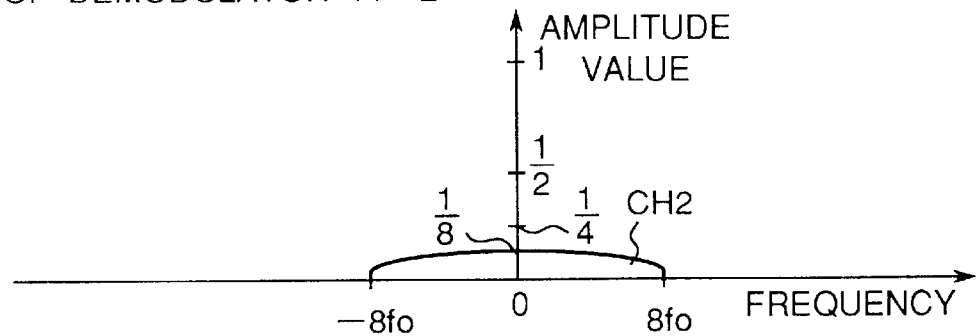

The frequency converting section 11a is comprised of two mixers 401a and 401b, a local oscillator 402 for generating a local oscillation signal having a local oscillation frequency of $8f_0$, a $\pi/2$ phase shifter 403, and two LPFs 404a and 404b each of which low-pass-filters the frequency component ranging from 0 to $\pm 8f_0$. In a manner similar to that of the frequency converter 12 shown in FIG. 1, as shown in FIGS. 9A and 9B, the inputted data signal is frequency-converted so that the frequency of the center of the band signal component of each channel of the outputted data signal becomes zero, i.e., the inputted data signal is frequency-converted using the local oscillation frequency $8f_0$. The complex number data signal obtained by this frequency conversion is outputted from the LPFs 404a and 404b to a DSC 411 of the signal demodulating section 11b.

As is understood in comparison between the constructions shown in FIGS. 2 and 4, the front end stage (which is included to the NPF 416, the PPF 426, the NPF 436 and the PPF 446) of the signal demodulating section 11b is the circuit for separating a modulated signal comprised of frequency band components into respective frequency band components, and this circuit corresponds to the circuit for channel-separating the channels CH3 to CH6 in the circuit shown in FIG. 2. In this case, the PPFs 422, 424, 426 and 446 have identical specifications, i.e., are constituted having an identical positive pass-band ranging from 0 to $\pi$ on the $f=\omega/2\pi$ axis shown in FIG. 19, and each of the PPFs 422, 424, 426 and 446 band-pass-filters and outputs only the signal component in the positive pass-band of the inputted complex number data signal. Further, the NPFs 412, 414, 416 and 436 have identical specifications, i.e., are constituted having an identical negative pass-band ranging from 0 to $-\pi$ on the $f=\omega/2\pi$ axis shown in FIG. 19, and each of the NPFs 412, 414, 416 and 436 band-pass-filters and outputs only the signal component in the negative pass-band of the inputted complex number data signal. Further, the DSCs 411, 413, 415, 423 and 425 have identical specifications, each of the DSCs 411, 413, 415, 423 and 425 subjects the inputted complex number data signal to a downsampling process with Md=2 so as to outputs the processed signal. In this case, in the downsampling process with Md=2, as described in detail later, the inputted data signals are down-sampled every other one. By this operation, the outputted data signal has the followings:

(a) an amplitude which is one half of that of the inputted data signal;
(b) a bandwidth of each channel which is two times as great as that of each channel of the inputted data signal; and
(c) a spectrum which is obtained when the doubled spectrum is repeatedly shifted by $\pm\pi$.

Referring to FIG. 4, the peak of the $\pi/4$-shift QPSK modulated signal is located in the range of $-\pi/2$ to $+\pi/2$ as shown in FIG. 18. Therefore, the DSC 411 subjects the inputted data signal to the downsampling process with Md=2 in order to double the signal on the frequency axis, and then, outputs the processed data signal to the NPF 412 and the PPF 422. Then, the data signal outputted from the NPF 412 is outputted to the NPF 416 and the PPF 426 via the DSC 413, the NPF 414 and the DSC 415. On the other hand, the data signal outputted from the PPF 422 is outputted to the NPF 436 and the PPF 446 via the DSC 423, the PPF 424 and the DSC 425. In this case, the PPF 422 and the PPF 424 are used for separating and extracting the peak of the signal component of the code 00 and the peak of the signal component of the code 01 located on the positive normalized frequency side. On the other hand, the NPF 412 and the NPF 414 are used for separating and extracting the peak of the signal component of the code 11 and the peak of the signal component of the code 10 located on the negative normalized frequency side. In this case, the reason why the two-stage PPF 422 and PPF 424 or the two-stage NPF 412 and NPF 414 are used is that four peaks are located in close vicinity to the normalized frequency zero as shown in FIG. 18. Thus, the peaks of the signal components of the codes 11, 10, 01 and 00 can be band-pass-filtered by the NPF 416, the PPF 426, the NPF 436 and the PPF 446.

A complex number data signal outputted from the NPF 416 is inputted to the level detector 417, which calculates the amplitude value thereof, and then, a signal level signal representing the amplitude value of the calculation result is inputted to a non-inverted input terminal of a comparator 418. Further, a complex number data signal outputted from the PPF 426 is inputted to a level detector 427, which calculates the amplitude value thereof, and then, a signal level signal representing the amplitude value of the calculation result is inputted to a non-inverted input terminal of a comparator 428. Further, a complex number data signal outputted from the NPF 436 is inputted to a level detector 437, which calculates the amplitude value thereof, and then, a signal level signal representing the amplitude value of the calculation result is inputted to a non-inverted input terminal of a comparator 438. Further, a complex number data signal outputted from the PPF 446 is inputted to a level detector 447, which calculates the amplitude value thereof, and then, a signal level signal representing the amplitude value of the calculation result is inputted to a non-inverted input terminal of a comparator 448.

In this case, the inverted input terminals of the comparators 418, 428, 438 and 448 are grounded, i.e., a data signal of 0 is inputted thereto. Therefore, each of the comparators 418, 428, 438 and 448 detects whether or not the peak representing each code exists. When detecting the existence of a peak, each of the comparators 418, 428, 438 and 448 outputs a High level (referred to as an H-level hereinafter) detection signal to a code discriminator 450. When detecting no peak, each of the comparators 418, 428, 438 and 448 outputs a Low level (referred to as an L-level hereinafter) detection signal to the code discriminator 450. The signal level signals outputted from the level detectors 417, 427, 438 and 447 are inputted to an adder 451, which sums up the inputted signal level signals, and then, a signal representing the result of summation is inputted to a reference clock generator circuit 452. In response to this, the reference clock generator circuit 452 generates a reference clock which represents the time position at which the peak exists by a leading edge of the reference clock based on the inputted signal of the result of summation, and then, outputs the reference clock to the code discriminator 450. The code discriminator 450 outputs a demodulated data signal of the code 11 when an H-level detection signal is inputted from the comparator 418 at the leading edge of the reference clock. The code discriminator 450 outputs a demodulated data signal of the code 10 when the H-level detection signal is inputted from the comparator 428 at the leading edge of the reference clock. The code discriminator 450 outputs a demodulated data signal of the code 01 when the H-level detection signal is inputted from the comparator 438 at the leading edge of the reference clock. The code discriminator 450 outputs a demodulated data signal of the code 00 when the H-level detection signal is inputted from the comparator 448 at the leading edge of the reference clock.

In the above-mentioned demodulator 11, level detectors 461 and 462 are provided in a stage subsequent to the DSCs 413 and 423 in a manner similar to that of the channel separating filter bank 10 shown in FIG. 3. A signal demodulating section controller 470 stops the operation of the circuits of the stage of the NPF 414 and subsequent stages in accordance with the disable control signal generated when no signal exists in the output terminal of the DSC 413, and the signal demodulating section controller 470 stops the operation of the circuits of the stage of the PPF 424 and subsequent stages in accordance with the disable control signal generated when no signal exists in the output terminal of the DSC 423.

In each of the comparators 418, 428, 438 and 448 shown in FIG. 4, the zero-level is used as a threshold value for detecting the existence of a signal. However, the present invention is not limited to this, and a positive level close to zero may be used.

In the above-mentioned demodulator 11, there are used a two-stage filter bank of the NPF 412 to the DSC 415 and a two-stage filter bank of the PPF 422 to the DSC 425. However, the present invention is not limited to this, and each of them may be a one-stage filter bank. In this case, a level detector is provided in the stage subsequent to the last DSC of the one-stage filter bank, and when no signal exists in the output terminal of the DSC, the operations of the circuits of the stages subsequent to the DSC may be stopped.

Furthermore, the DSC 411 may be eliminated when it is unnecessary to provide the DSC 411 according to the spectrum characteristic of a PSK-modulated signal.

The π/4-shift QPSK modulation system is used in the above-mentioned preferred embodiment. However, in a further PSK-modulation system such as BPSK (Binary Phase Shift Keying) QPSK (Quadrature Phase Shift Keying), 16-value PSK, 256-value PSK or the like which does not execute shifting operation or differential operation, the frequency of the peak changes according to the code in a manner similar to that of the present preferred embodiment. Therefore, a demodulator can be constituted in a manner similar to that of the demodulator 11 for a further PSK-modulation system such as BPSK, QPSK, 16-value PSK, 256-value PSK or the like.

The above-mentioned preferred embodiment has been described based on a radio system having eight channels. However, the present invention is not limited to this, and the present invention can be applied to a radio system having a plurality of channels, bands of which are separated to each other.

FILTER BANKING PROCESS

Figure 22:
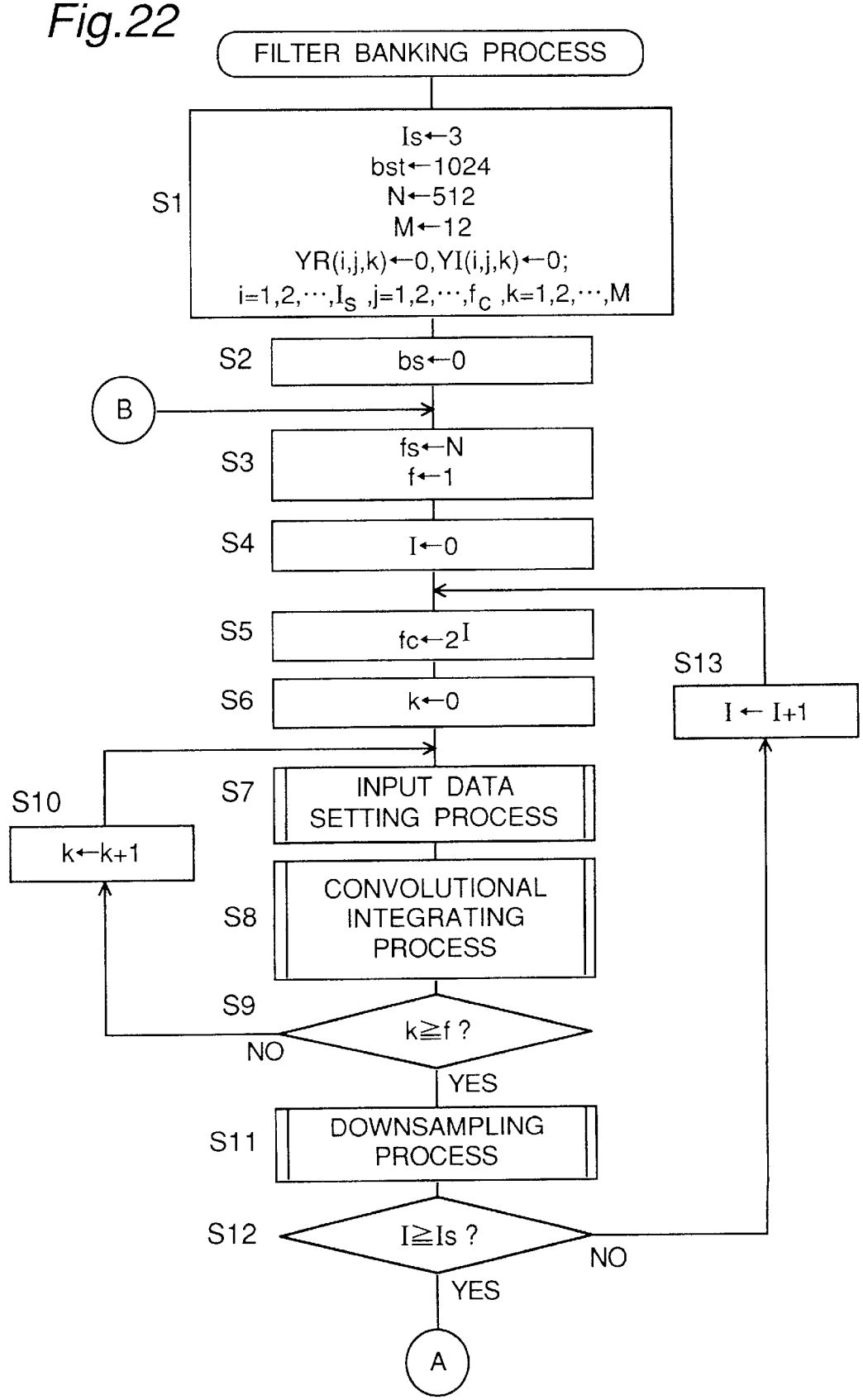
FIG. 22 is a flowchart showing a first part of a filter banking process of a main routine showing a control flow when the channel separating filter bank 10 shown in FIG. 2 is implemented by DSP software.
Figure 23:
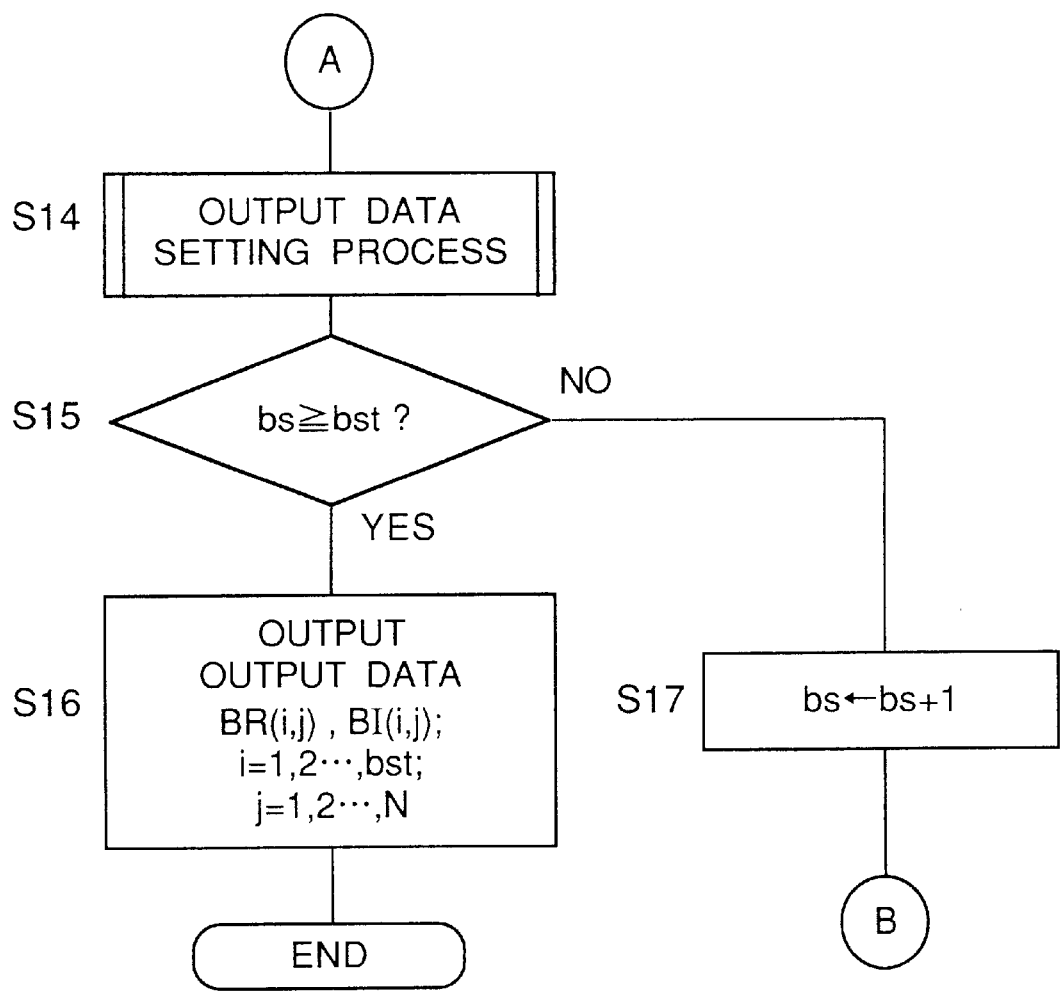
FIG. 23 is a flowchart showing a second part of the filter banking process of the main routine.

Finally, a control flow when the channel separating filter bank 10 shown in FIG. 2 is constituted by a digital signal processor (referred to as a DSP hereinafter) comprising a program storage ROM and a work area RAM, and when the filter banking process is implemented by software will be described. FIGS. 22 and 23 are flowcharts showing an example of the main routine of the filter banking process. According to the filter banking process, an inputted signal data is divided into its real number portion (I-channel signal) AR(i, j) and its imaginary number portion (Q-channel signal) AI(i, j), and then the divided two signals data are inputted in parallel. Then output signal data obtained by the filter banking process is divided into its real number portion (I-channel signal) BR(i, j) and its imaginary number portion (Q-channel signal) BI(i, j), and then, the divided two signal data are outputted in parallel. In this case, i represents a frame number, and j represents a data number in each frame. Furthermore, in the filter banking process, an inputted signal data of 1024 frames having 512 pieces of data per frame is collectively subjected to the process.

Referring to FIG. 22, an initializing process is executed in step S1. In this case, 3 is substituted into a total stage number Is, 1024 is substituted into a maximum frame number bst, 512 is substituted into a data number N included in one frame, and 12 is substituted into a filter length M corresponding to the filter length of each of the PPF and the NPF. Further, a real number portion YR(i, j, k) and an imaginary number portion YI(i, j, k) of signal data for real time process in which the hind part data of the preceding burst frame is stored for real time process use by the filter length M are each initialized to zero. Then, in step S2, a state variable parameter bs for counting the number of frames is initialized to zero. Further, in step S3, the above-mentioned number N is substituted into a filter number fs existing in each stage, and then one is substituted into a parameter of the number f of filter pairs that are actually included in the number fc of filter pairs existing in each stage (a pair of PPF and NPF is referred to as a filter pair in the present preferred embodiment). Then, in step S4, a state variable parameter I for counting the number of stages of filter banks is initialized to zero. In step S5, $2^I$ is calculated, and then, the calculated value of $2^I$ is substituted into the filter pair number parameter fc. In step S6, a state variable parameter k for counting the number of filter pairs of each stage is initialized to zero.

Then, in step S7, an input data setting process is executed. In this process, data are processed in a unit of burst, and therefore, there is executed a process for constructing input data by adding the hind part (filter length) of the data which has been previously transmitted at the preceding burst as a header to the current data in order to make apparently continuous data. Subsequently, in step S8, a convolutional integrating process is executed. In this process, a product-sum operation is executed for convolutional integration, and an energy value of the inputted signal is calculated. Further, comparing the calculated energy value with a predetermined threshold value Thr (the threshold value is preferably preset to zero or a positive value close to zero in the present preferred embodiment) is executed in order to decide whether or not a signal exists, and then on/off information representing whether or not the following software process is to be executed is inputted. Further, in step S9, it is decided whether or not the parameter k is equal to or larger than a set value f. When the parameter k is smaller than the set value f, k is incremented by one in step S10, and the program flow returns to step S7, and then continuing the above-mentioned process.

On the other hand, when the parameter k is equal to or larger than the set value f in step S9, it is decided that the execution of the process of the predetermined filter pair has been completed, and the downsampling process is executed in step S11. In this case, the downsampling process is executed by sampling the inputted signals at intervals of two. Then, in step S12, it is decided whether or not the parameter I is equal to or larger than the set value Is. When the parameter I is smaller than the set value Is, the parameter I is incremented by one in step S13, and the program flow proceeds to step S5, and then repeating the above-mentioned process.

On the other hand, when the parameter I is equal to or larger than the set value Is in step S12, the program flow proceeds to step S14 in FIG. 23, and then executing an output data setting process. In this process, there is executed a process for replacing a real number portion DR (filter pair number, data number) and an imaginary number portion DI (filter pair number, data number) of an intermediate signal data obtained by the downsampling process with a real number portion BR (frame number, filter pair number, data number) and an imaginary number portion BI (frame number, filter pair number, data number) of the output signal data, respectively. Subsequently, in step S15, it is decided whether or not the parameter bs is equal to or larger than a set value bst. When the parameter bs is smaller than the set value bst, the parameter bs is incremented by one in step S17, and the program flow returns to step S3 in FIG. 22, and then repeating the above-mentioned process. On the other hand, when the parameter bs is equal to or larger than the set value, the output signal data BR(i, j) and BI(i, j) is outputted to the demodulator 11 in step S16.

INPUT DATA SETTING PROCESS

Figure 24:
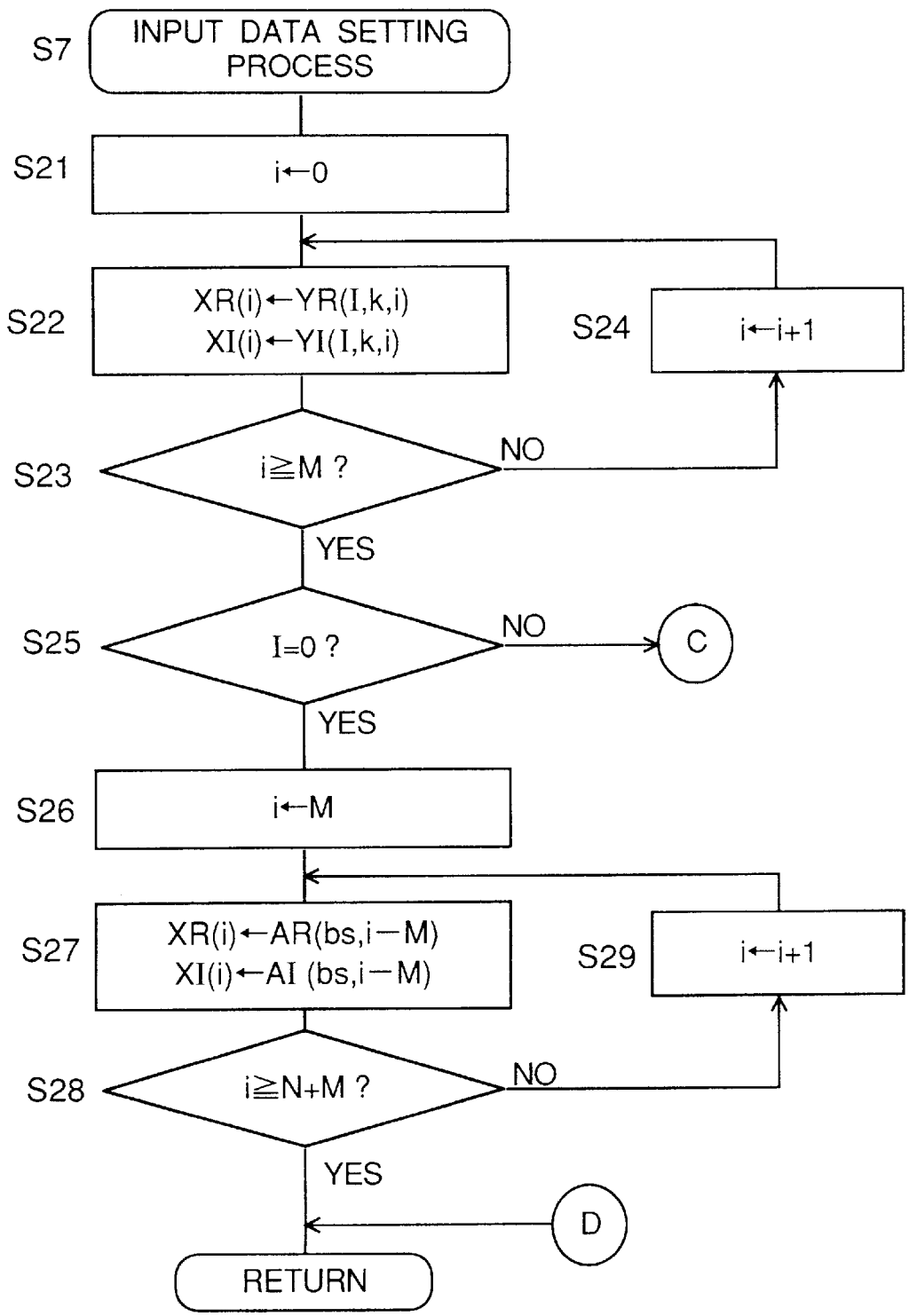
FIG. 24 is a flowchart showing a first part of an input data setting process shown in FIG. 22.
Figure 25:
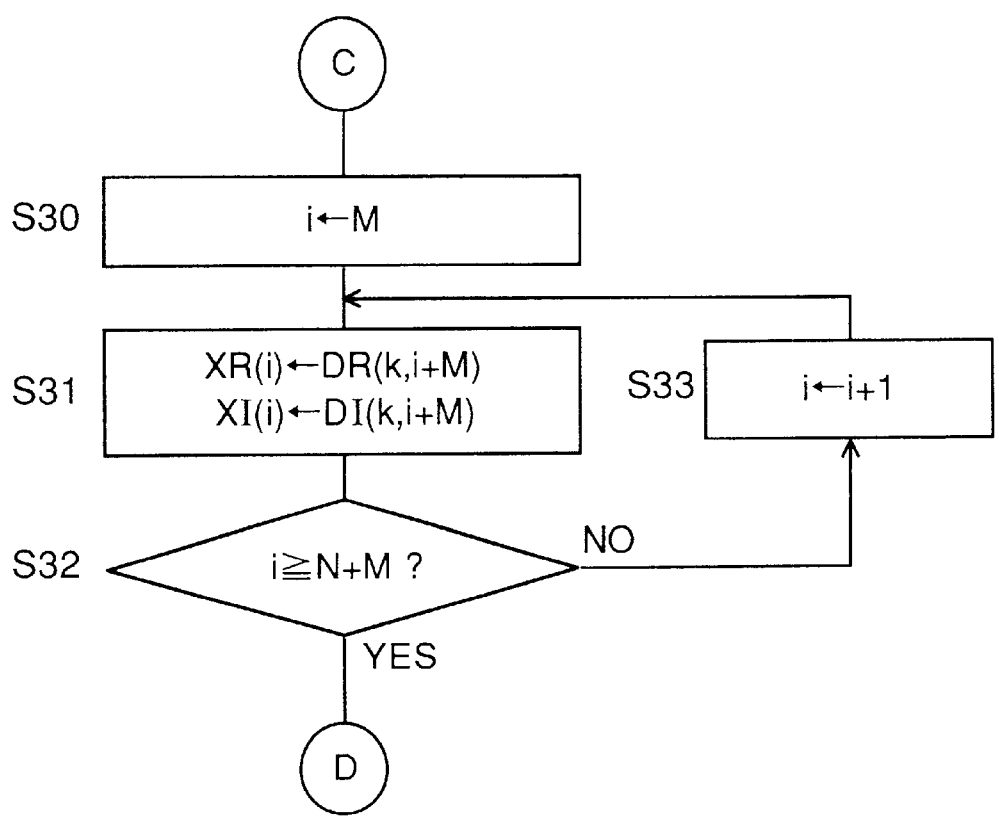
FIG. 25 is a flowchart showing a second part of the input data setting process shown in FIG. 22.

FIGS. 24 and 25 are flowcharts of the input data setting process shown in FIG. 22. A construction of the data array which is used in this process is as follows:

(a) a real number portion AR (frame number, data number) of the inputted signal data;
(b) an imaginary number portion AI (frame number, data number) of the inputted signal data;
(c) a real number portion DR (filter pair number, data number) of the intermediate signal data;
(d) an imaginary number portion DI (filter pair number, data number) of the intermediate signal data;
(e) a real number portion YR (stage number, filter pair number, data number) of the signal data for real time process;
(f) an imaginary number portion YI (stage number, filter pair number, data number) of the signal data for real time process;
(g) a real number portion XR (data number) of the signal data for convolutional integration;
(h) an imaginary number portion XI (data number) of the signal data for convolutional integration;
(i) a state variable parameter I for counting the number of stages;
(j) a state variable parameter k for counting the number of filter pairs in each stage; and
(k) the filter length M.

Referring to FIG. 24, the parameter i for counting the filter length is initialized to zero in step S21. Thereafter, in step S22, the real number portion YR(I, k, i) of the signal data for real time process is substituted into the real number portion XR(i) of the signal data for convolutional integration, and the imaginary number portion YI(I, k, i) of the signal data for real time process is substituted into the imaginary number portion XI(i) of the signal data for convolutional integration. In this case, the hind part data of the preceding burst frame is stored by the filter length M for real time process in the signal data YR(I, k, i) and YI(I, k, i) for real time process. Therefore, in the input data setting process, the signal data of the last M pieces of the inputted signal data that has passed through out of the preceding burst frame data is attached to the head of N pieces of the actual inputted signal data, and this results in that the signal data XR(i) and XI(i) for convolutional integration have a data array having a data length of (N+M).

The process of step S22 is repeatedly executed by the processes of steps S22 and S23 until the data number i becomes M, incrementing the data number i by one. When the parameter i becomes the set value M, it is decided in step S25 whether or not the state variable parameter I for counting the number of stages is zero. When the parameter I is zero, it is decided that the current filter bank is the filter bank of the first stage, and the set value M is substituted into the parameter i in step S26. Thereafter, in step S27, the real number portion AR(bs, i–M) of the inputted signal data is substituted into the real number portion XR(i) of the signal data for convolutional integration, and the imaginary number portion AI(bs, i–M) of the inputted signal data is substituted into the imaginary number portion XI(i) of the signal data for convolutional integration. The process of step S27 is repeatedly executed by the processes of steps S28 and S29 until the data number i becomes (N+M), incrementing the data number i by one, and thereafter, the program flow returns to the main routine.

When the state variable parameter I for counting the number of stages is not zero in step S25, it is decided that the current filter bank is not the filter bank of the first stage, and the program flow proceeds to step S30 of FIG. 25, and then the set value M is substituted into the parameter i. Thereafter, in step S31, the real number portion DR(k, i+M) of the intermediate signal data is substituted into the real number portion XR(i) of the signal data for convolutional integration, and the imaginary number portion DI(k, i+M) of the intermediate signal data is substituted into the imaginary number portion XI(i) of the signal data for convolutional integration. The process of step S31 is repeatedly executed by the processes of steps S32 and S33 until the data number i becomes (N+M) incrementing the data number i by one, and. thereafter, the program flow returns to the main routine.

CONVOLUTIONAL INTEGRATING PROCESS

Figure 26:
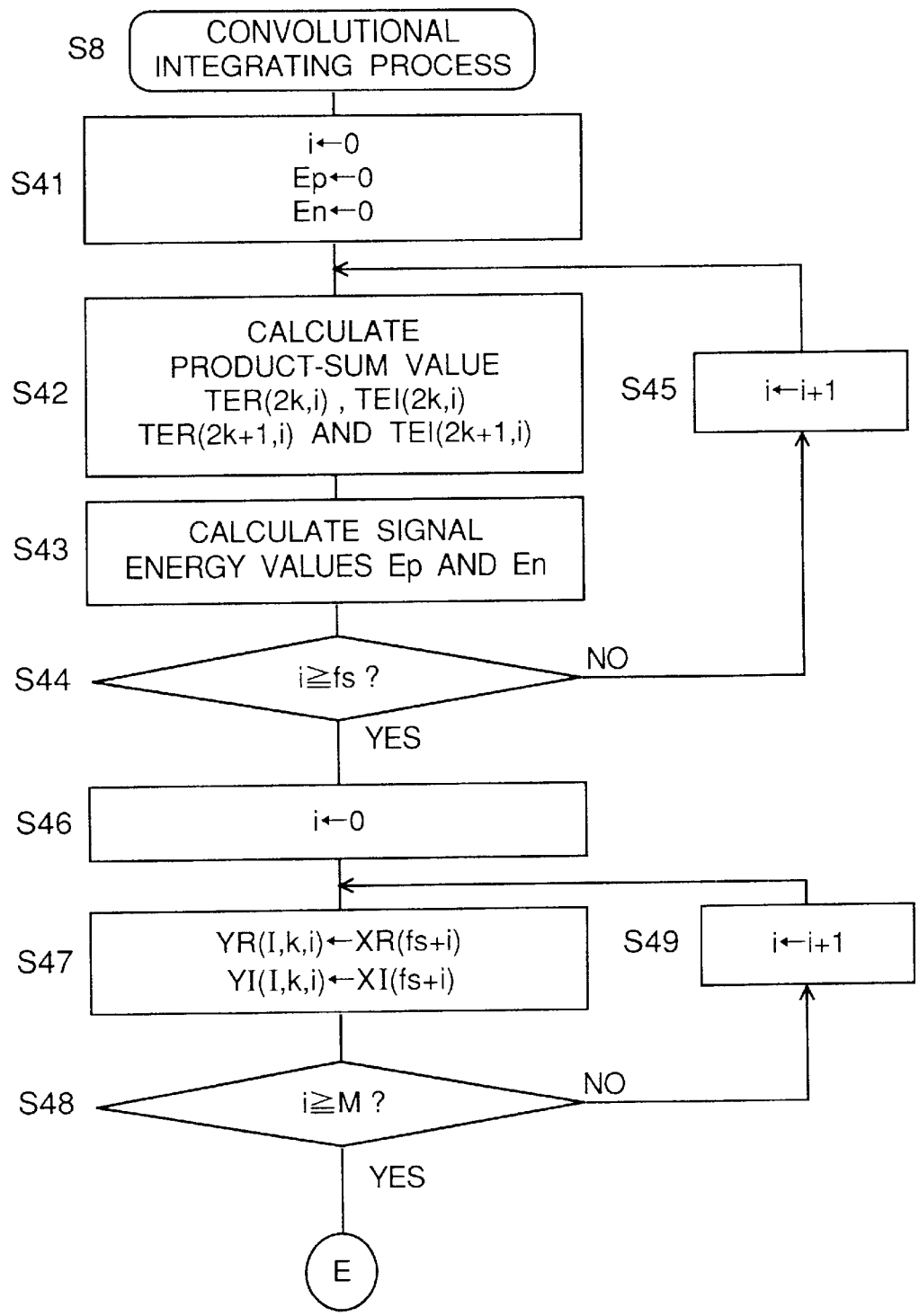
FIG. 26 is a flowchart showing a first part of a convolutional integrating process shown in FIG. 22.
Figure 27:
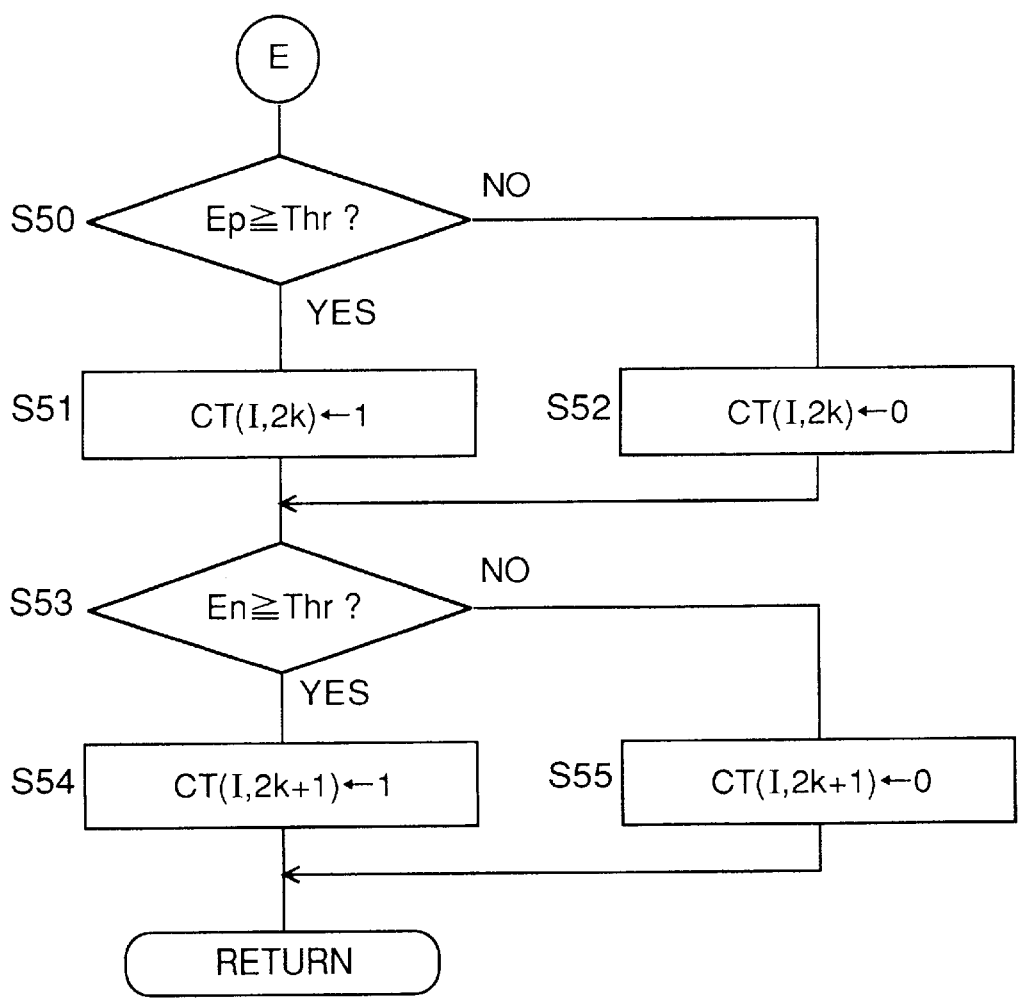
FIG. 27 is a flowchart showing a second part of the convolutional integrating process shown in FIG. 22.

FIGS. 26 and 27 are flowcharts of the convolutional integrating process shown in FIG. 22. Input and output arguments which are used in the convolutional integrating process are as follows:

(a) a real number portion HPR (tap number) of the filter coefficient of the PPF;
(b) an imaginary number portion HPI (tap number) of the filter coefficient of the PPF;
(c) a real number portion HNR (tap number) of the filter coefficient of the NPF;
(d) an imaginary number portion HNI (tap number) of the filter coefficient of the NPF;
(e) a real number portion XR (data number) of the signal data for convolutional integration;
(f) an imaginary number portion XI (data number) of the signal data for convolutional integration;
(g) a real number portion YR (stage number, filter pair number, data number) of the signal data for real time process;
(h) an imaginary number portion YI (stage number, filter pair number, data number) of the signal data for real time process;
(i) a real number portion TER (filter number, data number) of the signal data for convolutional integration;
(j) an imaginary number portion TEI (filter number, data number) of the signal data for convolutional integration;
(k) a signal energy value Ep that has passed through the PPF;
(l) a signal energy value En that has passed through the NPF;
(m) the state variable parameter k for counting the filter pairs of each stage;
(n) the filter length M;
(o) the state variable parameter I for counting the number of stages; and
(p) the threshold value Thr of the signal level, which is the threshold value reference level inputted to the non-inverted input terminal of each of the comparators 418, 428, 438 and 448 shown in FIG. 4, and although the threshold value Thr is set to zero in FIG. 4, it is preferably set to zero or a positive real number close to zero in the case of software.

Referring to FIG. 26, in step S41, the parameter i of the data number is initialized to zero, and the signal energy values Ep and En are each initialized to zero. Subsequently, in step S42, the real number portion TER(2k, i) and the imaginary number portion TEI(2k, i) as well as the real number portion TER(2k+1, i) and the imaginary number portion TEI(2k+1, i) of the product-sum operation value are calculated using the following equations (16) to (19).

$$TER(2k, i) = \sum_{p=0}^{M} HPR(p)XR(i+M-p) - HPI(p)XI(i+M-p) \quad (16)$$

$$TEI(2k, i) = \sum_{p=0}^{M} HPI(p)XR(i+M-p) + HPR(p)XI(i+M-p) \quad (17)$$

$$TER(2k+1, i) = \sum_{p=0}^{M} HNR(p)XR(i+M-p) - HNI(p)XI(i+M-p) \quad (18)$$

$$TEI(2k+1, i) = \sum_{p=0}^{M} HNI(p)XR(i+M-p) + HNR(p)XI(i+M-p) \quad (19)$$

In this case, HPR(p) is the real number portion of the filter transfer coefficient of the PPF and corresponds to Re(h(p)) of the PPF, while HPI(p) is the imaginary number portion of the filter transfer coefficient of the PPF and corresponds to Im(h(p)) of the PPF.

Subsequently, in step S43, the signal energy values Ep and En are calculated using the following equations (20) and (21). In this case, the calculated value of the right member of each of the equations (20) and (21) is substituted into the left member.

$$Ep \leftarrow Ep + TER^2(2k, i) + TEI^2(2k, i) \quad (20)$$

$$En \leftarrow En + TER^2(2k+1, i) + TEI^2(2k+1, i) \quad (21)$$

Subsequently, the processes in steps S42 and S43 are repeated by the process of the steps S44 and S45 until the parameter i becomes the set value fs, incrementing the parameter i by one. Further, in step S46, the parameter i is initialized to zero. Thereafter, in step S47, the real number portion XR(fs+i) of the signal data for convolutional integration is substituted into the real number portion YR(I, k, i) of the signal data for real time process, and the imaginary number portion XI(fs+i) of the signal data for convolutional integration is substituted into the imaginary number portion YI(I, k, i) of the signal data for real time process. Then, the process of step S47 is repeated by the steps S48 and S49 until the parameter i becomes the set value M, incrementing the parameter i by one, and thereafter, the program flow proceeds to step S50 of FIG. 27.

The processes of the subsequent steps S50 to S52 are provided for setting the signal on/off information data when the filter number is an even number (namely, in the case of the signal that has passed through the PPF). The processes of steps S53 to S55 are provided for setting the signal on/off information data when the filter number is an odd number (namely, in the case of the signal that has passed through the NPF).

In step S50 of FIG. 27, it is decided whether or not the signal energy value Ep passing through the PPF is equal to or larger than the threshold value Thr. When the energy value Ep is equal to or larger than the threshold value Thr, it is decided that a signal exists, and after one is set to the signal on/off information data CT(I, 2k), the program flow proceeds to step S53. On the other hand, when the energy value Ep is smaller than the threshold value Thr in step S53, it is decided that no signal exists, and thereafter, zero is set to the signal on/off information data CT(I, 2k), then the program flow proceeds to step S53. Subsequently, in step S53, it is decided whether or not the signal energy value En passing through the NPF is equal to or larger than the threshold value Thr. When the energy value En is equal to or larger than the threshold value Thr, it is decided that a signal exists, and thereafter, one is set to the signal on/off information data CT(I, 2k+1), the program flow returns to the main routine. On the other hand, when the energy value En is smaller than the threshold value Thr in step S53, it is decided that no signal exists, and thereafter, zero is set to the signal on/off information data CT(I, 2k+1), then the program flow returns to the main routine.

DOWNSAMPLING PROCESS

Figure 28:
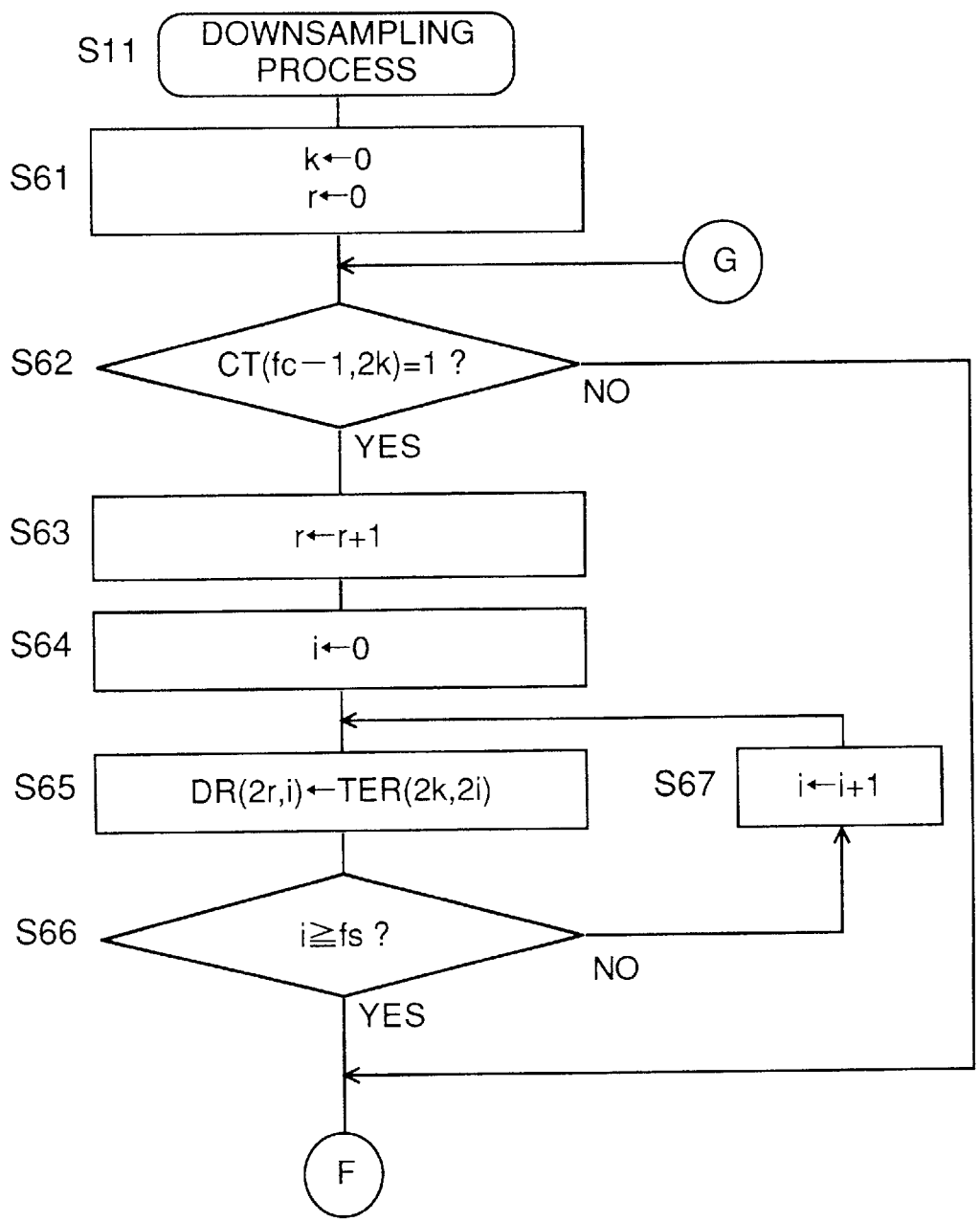
FIG. 28 is a flowchart showing a first part of a downsampling process shown in FIG. 22.
Figure 29:
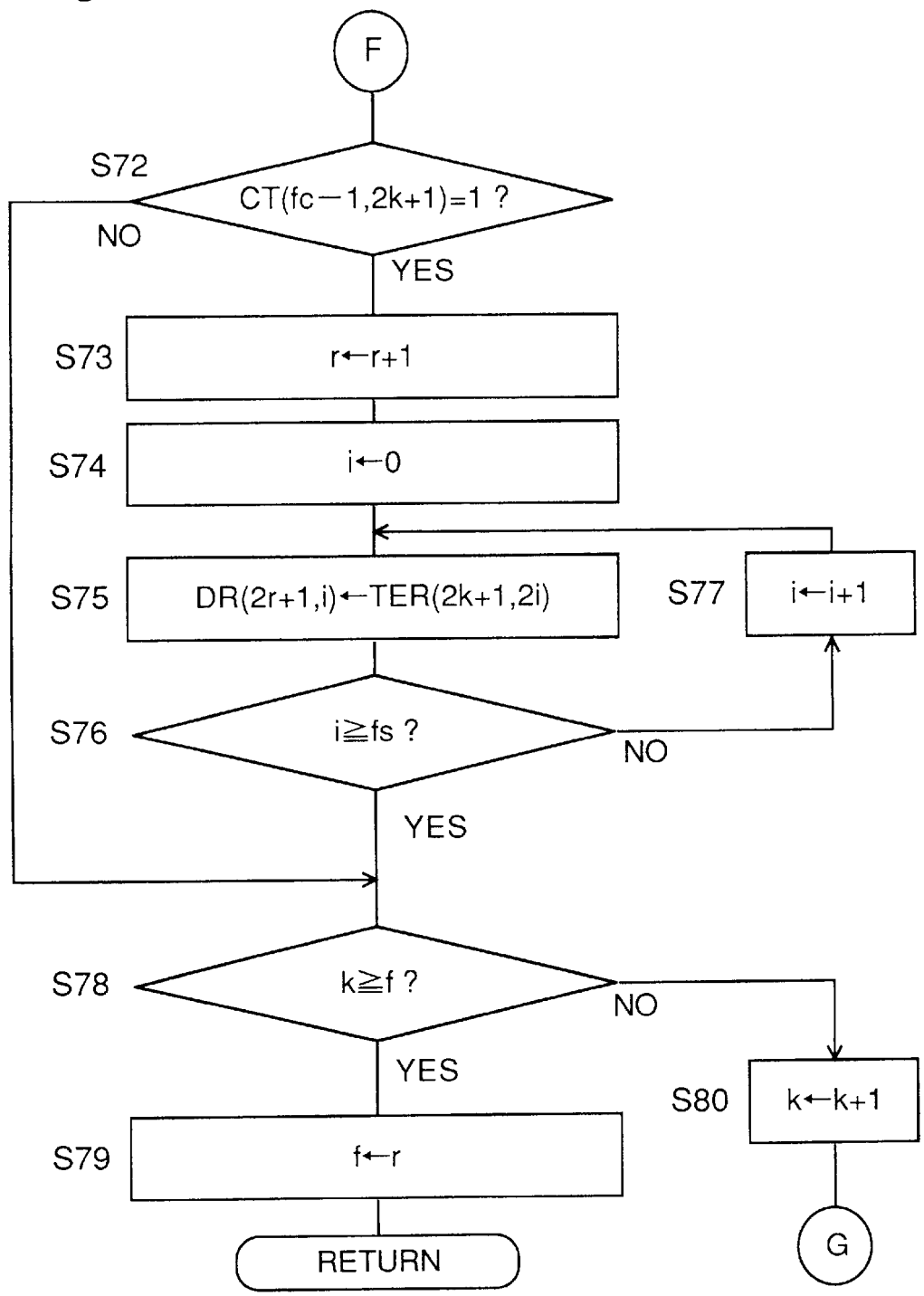
FIG. 29 is a flowchart showing a second part of the downsampling process shown in FIG. 22.

FIGS. 28 and 29 are flowcharts of the downsampling process shown in FIG. 22. In this case, the actual downsampling process is executed in step S65 shown in FIG. 28 and in step S75 shown in FIG. 29. Arguments which are used in the downsampling process are as follows:

(a) a state variable k for counting the filter pairs when the signal is turned on;
(b) a variable parameter r for counting the number of filter pairs when the signal is turned on in the filter pair of the next stage;
(c) a real number portion TER (filter number, data number) of the signal data for convolutional integration;
(d) an imaginary number portion TEI (filter number, data number) of the signal data for convolutional integration;
(e) a real number portion DR (filter pair number, data number) of the intermediate signal data;
(f) an imaginary number portion DI (filter pair number, data number) of the intermediate signal data;
(g) an on/off information data CT (stage number, filter number) for indicating whether or not the filter pair of the next stage is to be operated;
(h) a number f of filter pairs when the signal is turned on every stage of the filter pairs; and
(i) a number fs of the filters existing in every stage of the filter pairs.

It is to be noted that the PPF signal output is yielded when the filter number is an even number, while the NPF signal output is yielded when the filter number is an odd number. The filter number is given from the initial value of zero every stage.

Referring to FIG. 28, in step S61, the state variable k for counting the filter pairs when the signal is turned on is initialized to zero, and the variable parameter r for counting the filter pairs when the signal is turned on in the filter pair of the next stage is initialized to zero.

Subsequently, it is decided in step S62 whether or not the signal on/off information data CT(fc−1, 2k) is equal to one. When the answer of the judgment of step S62 is affirmative or YES, the parameter r is incremented by one in step S63, and the parameter i is initialized to zero in step S64. Thereafter, the program flow proceeds to step S65. On the other hand, when the answer of the judgment of step S62 is negative or NO in step S62, the program flow proceeds to step S72 of FIG. 29.

In step S65, the real number portion TER (2k, 2i) of the signal data for convolutional integration is substituted into the real number portion DR (2r, i) of the intermediate signal data. Then, the process of step S65 is repeated by the processes of steps S66 and S67 until the parameter i becomes the set value fs, incrementing the parameter i by one, and thereafter, the program flow proceeds to step S72 of FIG. 29.

Referring to FIG. 29, it is decided in step S72 whether or not the signal on/off information data CT(fc−1, 2k+1)=1. When the answer of the judgment of step S72 is YES, the parameter r is incremented by one in step S73, and the parameter i is initialized to zero in step S74. Thereafter, the program flow proceeds to step S75. On the other hand, when the answer of the judgment of step S72 is NO in step S72, the program flow proceeds to step S78.

In step S75, the real number portion TER (2k+1, 2i) of the signal data for convolutional integration is substituted into the real number portion DR (2r+1, i) of the intermediate signal data. Then, the process of step S75 is repeated by the processes of steps S76 and S77 until the parameter i becomes the set value fs incrementing the parameter i by one, and thereafter, the program flow proceeds to step S78.

In step S78, it is decided whether or not the parameter k is the set value f. When the answer of the judgment of step S78 is NO, the parameter k is incremented by one in step S80, and the program flow returns to step S62, then executing the downsampling process in regard to another filter number. On the other hand, when the answer of the judgment of step S78 is YES in step S78, the parameter r is set to the parameter f, and then the program flow returns to the main routine.

OUTPUT DATA SETTING PROCESS

Figure 30:
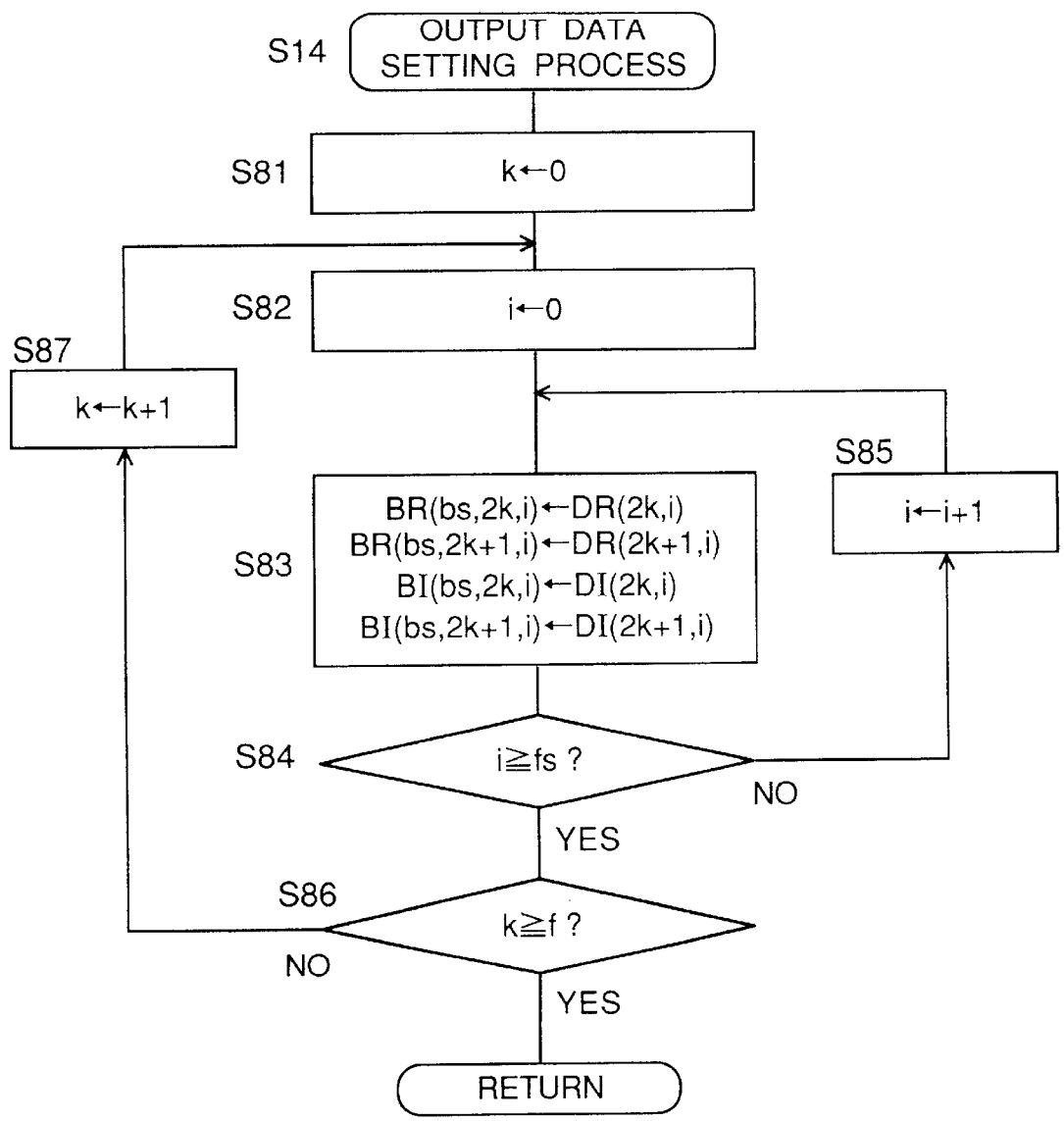
FIG. 30 is a flowchart showing an output data setting process shown in FIG. 23.

FIG. 30 is a flowchart of the output data setting process shown in FIG. 23. The output data setting process is provided for replacing a real number portion DR (filter pair number, data number) and an imaginary number portion DI (filter pair number, data number) of the intermediate signal data obtained by the downsampling process with a real number portion BR (frame number, filter pair number, data number) and an imaginary number portion BI (frame number, filter pair number, data number) of the output signal data, respectively. Arguments which are used in the output data setting process are as follows:

(a) a real number portion BR (frame number, filter pair number, data number) of the output signal data;
(b) an imaginary number portion BI (frame number, filter pair number, data number) of the output signal data;
(c) a real number portion DR (filter pair number, data number) of the intermediate signal data;
(d) an imaginary number portion DI (filter pair number, data number) of the intermediate signal data;
(e) a number bs of receiving signal frames;
(f) a state variable parameter fs for counting the frame size;
(g) a number N of data included in one frame; and
(h) a number f of filter pairs of each stage of the filter pairs.

Referring to FIG. 30, the state variable parameter k is initialized to zero in step S81, and thereafter the state variable parameter i is initialized to zero in step S82. Then, in step S83, the real number portion DR(2k, i) of the intermediate signal data is substituted into the real number portion BR(bs, 2k, i) of the output signal data, the real number portion DR(2k+1, i) of the intermediate signal data is substituted into the real number portion BR(bs, 2k+1, i) of the output signal data, the imaginary number portion DI(2k, i) of the intermediate signal data is substituted into the imaginary number portion BI(bs, 2k, i) of the output signal data, and the imaginary number portion DI(2k+1, i) of the intermediate signal data is substituted into the imaginary number portion BI(bs, 2k+1, i) of the output signal data. Then, it is decided in step S84 whether or not the state variable parameter i is equal to or lager than the set value fs. When the answer of the judgment of step S84 is NO, the state variable parameter i is incremented by one in step S85, and thereafter, the program flow proceeds to step S83. On the other hand, when the answer of the judgment of step S84 is YES, the program flow proceeds to step S86.

In step S86, it is decided whether or not the state variable parameter k is equal to or larger than the set value f. When the answer of the judgment of step S86 is NO, the state variable parameter k is incremented by one in step S87, and the program flow returns to step S82, then repeating the above-mentioned process. On the other hand, when the answer of the judgment of step S86 is YES in step S86, it is decided that the output data setting process has been completed, and the program flow returns to the main routine.

In the above-mentioned filter banking process, the software when the channel separating filter bank 10 is constituted by a DSP (Digital Signal Processor) has been described. However, it is acceptable to constitute the demodulator 11 by a DSP and constitute the filter bank 10 by software in a manner similar to those of FIGS. 22 to 30. In this case, as is apparent from the comparison of the circuit of the channel separating filter bank 10 shown in FIG. 2 with the circuit of the signal demodulating section 11b of the demodulator 11 shown in FIG. 4, in the hardware circuit, the DSCs 302, 312, 322, 332, 342, 352, 362 and 372 connected to the demodulator 11-1 to 11-8 are eliminated, and the circuit connected to the group consisting of the demodulator 11-7 and 11-8 to the PPF 221 as well as the circuit connected to the group consisting of the demodulator 11-1 and 11-2 to the NPF 211 are eliminated. According to the corresponding software, the corresponding portion can be eliminated.

ADVANTAGEOUS EFFECTS OF THE PRESENT PREFERRED EMBODIMENTS

Adavantageous Effects of Channel Separating Filter Bank 10

(a) Since a plurality of channels can be collectively processed in one base station, a reduced investment cost can be achieved. Furthermore, the circuit is allowed to be compacted, reduced in weight and simplified further than that of the prior art employing a band-pass filter.

(b) Since the channels can be separated by separating the frequency bands at which channel signals exist, a wasteful consumption current of hardware circuit operation can be reduced. Otherwise, when the channel separating circuit is constituted using software, the channel separating process can be executed at a higher speed by reducing the time of calculation through the elimination of a calculating process. This corresponds to the branching process of step S62 shown in FIG. 28 and the branching process of step S72 shown in FIG. 29. Its advantageous effect is significant in the downsampling process having a lot of repetitive calculations.

(c) The channel separation process can be achieved using, for example, a fast Fourier transformation (referred to as an FFT hereinafter). In comparison with the case of FET, the number of repetitive processes of the product-sum operation and the like can be remarkably reduced, and therefore, the process can be made faster than that of the FFT case.

(d) Since the signals inputted to the PPFs, the NPFs and the DSCs are made to be complex numbers, the sampling rate can be made lower. With this arrangement, the circuit constituted by hardware can be made up of a circuit requiring a lower manufacturing cost. On the other hand, in the case of the circuit constituted by software, the designing cost and the manufacturing cost can be reduced.

(e) The PPFs, the NPFs and the DSCs used in the demodulator 11 can be constituted by hardware or software that executes the process of identical specifications. Therefore, the designing can be very simple and the manufacturing cost can be remarkably reduced.

ADVANTAGEOUS EFFECTS OF DEMODULATOR 11

(a) The circuit can be made much simpler than the prior art demodulator employing a delay detection system or differential coherent detection method.

(b) Since the peak of each code can be separately and extracted by separating the vicinity of frequency bands at each of which a signal component having a code exist, a wasteful consumption current of hardware circuit operation can be reduced. On the other hand, when the code separating circuit is constituted by software, the code separating process can be executed at a higher speed by reducing the time of calculation through the elimination of calculation.

(c) Since the demodulator 11 can be constituted by the same hardware or software as that of the channel separating filter bank 10, the time required for designing can be reduced. When the demodulator 11 is constituted by software, identical software can be used for the PPFs, the NPFs and the DSCs, and therefore, the memory capacity of the ROM connected to the DSP can be remarkably reduced.

(d) When the demodulator 11 is constituted by software, it can be made to execute a demodulating process by means of the same DSP as that of the channel separating filter bank 10, and therefore, the hardware circuit scale is simplified.

(e) The PPFs, the NPFs and the DSCs which are used in the demodulator 11 can be constituted by hardware or software which executes the process of identical specifications. Therefore, the designing can be very simple and the manufacturing cost can be remarkably reduced.

Advantageous Effects of Combination of Channel Separating Filter Bank 10 and Demodulator 11

In particular, when the channel separating filter bank 10 is combined with the demodulator 11 and the circuits 10 and 11 are constituted by software, the channel separating process and the demodulating process can be executed by means of the same DSPs, and therefore, the hardware circuit scale is simplified. In this case, identical software can be used for the PPFs, the NPFs and the DSCs, and therefore, the memory capacity of the ROM connected to the DSP can be remarkably reduced.

MODIFICATION EXAMPLES

The above-mentioned preferred embodiment is provided with the demodulator 11 employing a filter bank. However, the present invention is not limited to this, and the prior art delay detection method (or differential coherent detection method) demodulator may be used.

The above-mentioned preferred embodiment employs the demodulator 11 constituted by the PPFs, the NPFs and the DSCs. However, the code discrimination may be executed by detecting the peak of the PSK energy by means of FFT.

Furthermore, since the receiver apparatus of the can be made up of a digital circuit, the center frequency of the pass-band of each channel can be adjusted with a higher precision.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A channel separating filter apparatus for separating a frequency-multiplexed signal comprised of channel signals into respective channel signals, comprising:

frequency-converting means for frequency-converting the frequency-multiplexed signal into a plurality of channel signals, so that an average value of carrier wave frequencies of two channel signals which are located in a center of the frequency-multiplexed signal and are adjacent to each other becomes substantially zero, and for outputting the plurality of frequency-converted channel signals; and channel separating means for separating the plurality of frequency-converted channel signals outputted from said frequency-converting means into respective channel signals each having only a frequency component of each channel signal, wherein said channel separating means comprises at least first stage filter bank, and wherein said first stage filter bank comprises:

a first positive pass filter for band-pass-filtering only a first signal having a signal component of a predetermined positive frequency from the plurality of frequency-converted channel signals outputted from said frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the plurality of frequency-converted channel signals outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, thereby separating the frequency-multiplexed signal into at least two channel signals.

2. The channel separating filter apparatus as claimed in claim 1, wherein said channel separating means further comprises at least second stage filter bank, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

third processing means for executing a third downsampling process on the band-pass-filtered fifth signal outputted from said second positive pass filter and for outputting a sixth signal including a signal of at least one further channel which is obtained by the third downsampling process;

a second negative pass filter for band-pass-filtering only a seventh signal having a signal component of a predetermined negative frequency from the second signal outputted from said first processing means, and for outputting the band-pass-filtered seventh signal; and fourth processing means for executing a fourth downsampling process on the band-pass-filtered seventh signal outputted from said second negative pass filter and for outputting an eighth signal including a signal of at least one further channel which is obtained by the fourth downsampling process;

a third positive pass filter for band-pass-filtering only a ninth signal having a signal component of a predetermined positive frequency from the fourth signal outputted from said second processing means, and for outputting the band-pass-filtered ninth signal;

fifth processing means for executing a fifth downsampling process on the band-pass-filtered ninth signal outputted from said third positive pass filter and for outputting a tenth signal including a signal of at least one further channel which is obtained by the fifth downsampling process;

a third negative pass filter for band-pass-filtering only an eleventh signal having a signal component of a predetermined negative frequency from the fourth signal outputted from said second processing means, and for outputting the band-pass-filtered eleventh signal; and sixth processing means for executing a sixth downsampling process on the band-pass-filtered eleventh signal outputted from said third negative pass filter and for outputting a twelfth signal including a signal of at least one further channel which is obtained by the sixth downsampling process, thereby separating the frequency-multiplexed signal into at least four channel signals.

3. The channel separating filter apparatus as claimed in claim 2, further comprising:

first detecting means for detecting a signal level of the second signal outputted from said first processing means and for outputting a first detection signal when no second signal exists;

second detecting means for detecting a signal level of the fourth signal outputted from said second processing means and for outputting a second detection signal when no fourth signal exists; and operation control means, in response to the first detection signal outputted from said first detecting means, for controlling said second positive pass filter, said second negative pass filter and said third and fourth processing means to stop operations of said second positive pass filter, said second negative pass filter and said third and fourth processing means, and further, in response to the second detection signal outputted from said second detecting means, for controlling said third positive pass filter, said third negative pass filter and said fifth and sixth processing means to stop operations of said third positive pass filter, said third negative pass filter and said fifth and sixth processing means.

4. A PSK receiver apparatus comprising:

receiving means for receiving a radio signal of a frequency-multiplexed signal comprised of channel signals each being a PSK-modulated signal;

a channel separating filter apparatus for separating the radio signal received by said receiving means into respective channel signals; and a PSK demodulator apparatus for demodulating the respective channel signals separated by said channel separating filter apparatus so as to generate respective demodulated channel signals, and for outputting the generated respective demodulated channel signals, and wherein said channel separating filter apparatus comprises:

frequency-converting means for frequency-converting the frequency-multiplexed signal into a plurality of channel signals, so that an average value of carrier wave frequencies of two channel signals which are located in a center of the frequency-multiplexed signal and are adjacent to each other becomes substantially zero, and for outputting the plurality of frequency-converted channel signals; and channel separating means for separating the plurality of frequency-converted channel signals outputted from said frequency-converting means into respective channel signals each having only a frequency component of each channel signal, wherein said channel separating means comprises at least first stage filter bank, and wherein said first stage filter bank comprises:

a first positive pass filter for band-pass-filtering only a first signal having a signal component of a predetermined positive frequency from the plurality of frequency-converted channel signals outputted from said frequency-converting means, and for outputting the band-pass-filtered first signal;

first processing means for executing a first downsampling process on the band-pass-filtered first signal outputted from said first positive pass filter and for outputting a second signal including a signal of at least one channel which is obtained by the first downsampling process;

a first negative pass filter for band-pass-filtering only a third signal having a signal component of a predetermined negative frequency from the plurality of frequency-converted channel signals outputted from said frequency-converting means, and for outputting the band-pass-filtered third signal; and second processing means for executing a second downsampling process on the band-pass-filtered third signal outputted from said first negative pass filter and for outputting a fourth signal including a signal of at least one further channel which is obtained by the second downsampling process, thereby separating the frequency-multiplexed signal into at least two channel signals.

5. The PSK receiver apparatus as claimed in claim 4, wherein said channel separating means further comprises at least second stage filter bank, and wherein said second stage filter bank comprises:

a second positive pass filter for band-pass-filtering only a fifth signal having a signal component of a predetermined positive frequency from the second signal outputted from said first processing means, and for outputting the band-pass-filtered fifth signal;

third processing means for executing a third downsampling process on the band-pass-filtered fifth signal outputted from said second positive pass filter and for outputting a sixth signal including a signal of at least one further channel which is obtained by the third downsampling process;

a second negative pass filter for band-pass-filtering only a seventh signal having a signal component of a predetermined negative frequency from the second signal outputted from said first processing means, and for outputting the band-pass-filtered seventh signal; and fourth processing means for executing a fourth downsampling process on the band-pass-filtered seventh signal outputted from said second negative pass filter and for outputting an eighth signal including a signal of at least one further channel which is obtained by the fourth downsampling process;

a third positive pass filter for band-pass-filtering only a ninth signal having a signal component of a predetermined positive frequency from the fourth signal outputted from said second processing means, and for outputting the band-pass-filtered ninth signal;

fifth processing means for executing a fifth downsampling process on the band-pass-filtered ninth signal outputted from said third positive pass filter and for outputting a tenth signal including a signal of at least one further channel which is obtained by the fifth downsampling process;

a third negative pass filter for band-pass-filtering only an eleventh signal having a signal component of a predetermined negative frequency from the fourth signal outputted from said second processing means, and for outputting the band-pass-filtered eleventh signal; and sixth processing means for executing a sixth downsampling process on the band-pass-filtered eleventh signal outputted from said third negative pass filter and for outputting a twelfth signal including a signal of at least one further channel which is obtained by the sixth downsampling process, thereby separating the frequency-multiplexed signal into at least four channel signals.

6. The PSK receiver apparatus as claimed in claim 5, wherein said channel separating filter apparatus further comprising:

first detecting means for detecting a signal level of the second signal outputted from said first processing means and for outputting a first detection signal when no second signal exists;

second detecting means for detecting a signal level of the fourth signal outputted from said second processing means and for outputting a second detection signal when no fourth signal exists; and operation control means, in response to the first detection signal outputted from said first detecting means, for controlling said second positive pass filter, said second negative pass filter and said third and fourth processing means to stop operations of said second positive pass filter, said second negative pass filter and said third and fourth processing means, and further, in response to the second detection signal outputted from said second detecting means, for controlling said third positive pass filter, said third negative pass filter and said fifth and sixth processing means to stop operations of said third positive pass filter, said third negative pass filter and said fifth and sixth processing means.

\* \* \* \* \*